(12) United States Patent
Lee et al.

(10) Patent No.: US 11,101,540 B2
(45) Date of Patent: Aug. 24, 2021

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Kyoung Yeon Lee, Incheon (KR); Tae Yong Lee, Gyeonggi-do (KR); Doo Soub Shin, Incheon (KR); Seon A Lee, Incheon (KR); Woo Bin Jung, Seoul (KR); Ji Yeon Ryu, Incheon (KR); Jin Young Khim, Seoul (KR)

(73) Assignee: Amkor Technology Singapore Holding PTE. LTD., Singapore (SG)

( * ) Notice: Subject to any disclaimer, the term of this patent is extended or adjusted under 35 U.S.C. 154(b) by 36 days.

(21) Appl. No.: 16/590,801

(22) Filed: Oct. 2, 2019

(65) Prior Publication Data
US 2021/0104809 A1  Apr. 8, 2021

(51) Int. Cl.
*H01Q 1/38* (2006.01)
*H01Q 1/22* (2006.01)
(Continued)

(52) U.S. Cl.
CPC ....... *H01Q 1/2283* (2013.01); *H01L 21/4853* (2013.01); *H01L 21/4857* (2013.01);
(Continued)

(58) Field of Classification Search
CPC ........ H01Q 1/2283; H01Q 1/50; H01Q 21/24; H01L 24/81; H01L 21/4853; H01L 24/08; H01L 23/3128; H01L 21/4857; H01L 23/49838; H01L 23/49822; H01L 21/565; H01L 24/16; H01L 21/568; H01L 23/66; H01L 23/552; H01L 23/49816; H01L 21/6835; H01L 25/16
See application file for complete search history.

(56) References Cited

U.S. PATENT DOCUMENTS

2007/0200748 A1\* 8/2007 Hoegerl .............. H01L 23/3128
342/85
2014/0293529 A1\* 10/2014 Nair ...................... H01Q 23/00
361/679.31
(Continued)

*Primary Examiner* — Dieu Hien T Duong
(74) *Attorney, Agent, or Firm* — Spectrum IP Law Group LLC

(57) ABSTRACT

A semiconductor device can comprise a substrate dielectric structure and a substrate conductive structure that traverses the substrate dielectric structure and comprises first and second substrate terminals; an electronic component with a component terminal coupled to the first substrate terminal; and a first antenna element with a first element terminal coupled to the second substrate terminal, a first element head side adjacent a first antenna pattern, a first element base side opposite the first element side, and a first element sidewall. The first element terminal can be exposed from the first element dielectric structure at the first element base side or at the first element sidewall. The first antenna pattern can be coupled to the substrate through the first element terminal. The substrate conductive structure can couple the first antenna element to the electronic component. Other examples and methods are also disclosed.

23 Claims, 35 Drawing Sheets

(51) Int. Cl.
  *H01L 23/00* (2006.01)
  *H01L 23/66* (2006.01)
  *H01L 23/31* (2006.01)
  *H01L 23/552* (2006.01)
  *H01L 25/16* (2006.01)
  *H01L 21/683* (2006.01)
  *H01L 21/56* (2006.01)
  *H01L 23/498* (2006.01)
  *H01L 21/48* (2006.01)
  *H01Q 1/50* (2006.01)
  *H01Q 21/24* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/49816* (2013.01); *H01L 23/49822* (2013.01); *H01L 23/49838* (2013.01); *H01L 23/552* (2013.01); *H01L 23/66* (2013.01); *H01L 24/08* (2013.01); *H01L 24/16* (2013.01); *H01L 24/81* (2013.01); *H01L 25/16* (2013.01); *H01Q 1/50* (2013.01); *H01Q 21/24* (2013.01); *H01L 2221/68359* (2013.01); *H01L 2223/6677* (2013.01); *H01L 2224/08237* (2013.01); *H01L 2224/16227* (2013.01); *H01L 2224/80006* (2013.01); *H01L 2924/19102* (2013.01); *H01L 2924/3025* (2013.01)

(56) References Cited

U.S. PATENT DOCUMENTS

| | | | |
|---|---|---|---|
| 2017/0237154 A1* | 8/2017 | Choudhury | H01Q 25/04 343/824 |
| 2018/0233465 A1* | 8/2018 | Spella | H01Q 15/10 |
| 2018/0332151 A1* | 11/2018 | Kamgaing | G06F 1/1613 |
| 2019/0115643 A1* | 4/2019 | Khan | H01Q 9/0485 |
| 2019/0181085 A1* | 6/2019 | Chen | H01L 24/09 |

* cited by examiner

SEMICONDUCTOR DEVICES AND METHODS OF MANUFACTURING SEMICONDUCTOR DEVICES

TECHNICAL FIELD

The present disclosure relates, in general, to electronic components, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
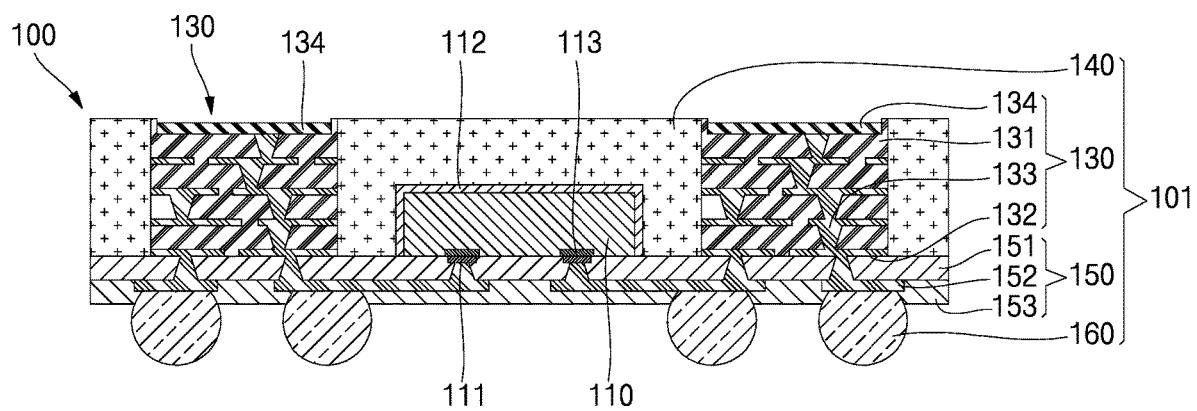
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device can comprise (a) a substrate comprising a substrate top side, a substrate bottom side a substrate dielectric structure between the substrate top side and the substrate bottom side, and a substrate conductive structure that traverses the substrate dielectric structure and comprises a first substrate terminal, and a second substrate terminal at the substrate top side, (b) an electronic component coupled to the substrate and comprising a component terminal coupled to the first substrate terminal, and (c) a first antenna element coupled to the substrate and comprising a first element dielectric structure, a first antenna pattern coupled to the first element dielectric structure, a first element terminal coupled to the second substrate terminal, a first element head side adjacent first antenna pattern, a first element base side opposite the first element side, and a first element sidewall between the first element head side and the first element base side. The first element terminal can be exposed from the first element dielectric structure at at least one of the first element base side or the first element sidewall. The first antenna pattern can be coupled to the substrate through the first element terminal. The first antenna element can be coupled to the substrate outside a footprint of the electronic component. The substrate conductive structure can couple the first antenna element to the electronic component.

Other examples are included in the present disclosure. Such examples may be found in the figures, in the claims, or in the description of the present disclosure.

FIG. 1 shows a cross-sectional view of an example semiconductor device 100. In the example shown in FIG. 1, semiconductor device 100 can comprise electronic component 110, antenna elements 130, encapsulant 140, substrate 150, and external interconnects 160.

Electronic component 110 can comprise internal interconnects 111 and electromagnetic interference (EMI) shield 112. Antenna elements 130 can comprise dielectric structure 131, conductive structures 132 and 133, and antenna patterns 134. Substrate 150 can comprise dielectric structures 151 and 153 and conductive structure 152.

Antenna elements 130, encapsulant 140, substrate 150 and external interconnects 160 can comprise or be referred to as semiconductor package 101 or package 101, and can protect electronic component 110 from external elements or environmental exposure. Semiconductor package 101 can provide electrical coupling between an external element and electronic component 110.

FIGS. 2A to 2I show cross-sectional views of an example method for manufacturing example semiconductor device 100. FIG. 3 shows a plan view of an example method for manufacturing example semiconductor device 100.

Figure 2A:
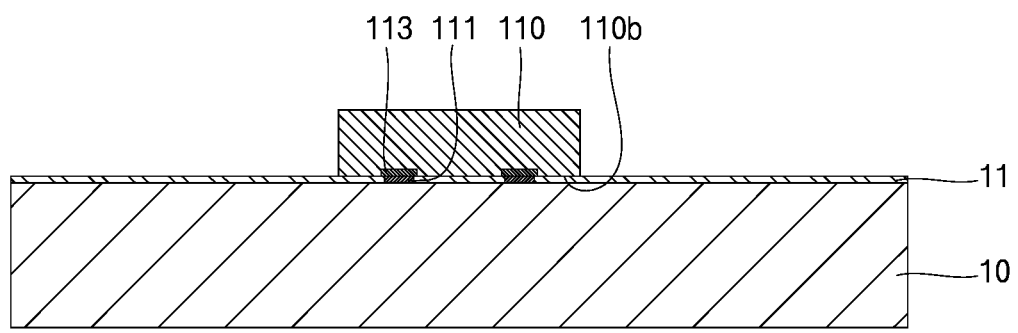
FIGS. 2A to 2I show cross-sectional views of an example method for manufacturing an example semiconductor device.
Figure 3:
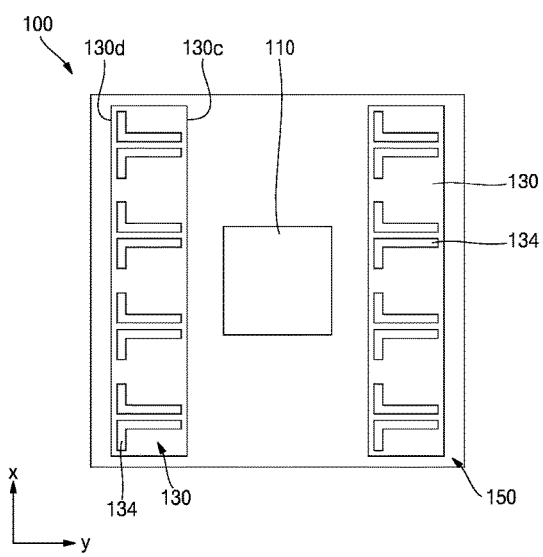
FIG. 3 shows a plan view of an example method for manufacturing an example semiconductor device shown in FIG. 2C.

FIG. 2A shows a cross-sectional view of semiconductor device 100 at an early stage of manufacture. In the example shown in FIG. 2A, bottom surface 110b of electronic component 110 can be attached to temporary bond layer 11 formed on carrier 10. In some examples, multiple electronic components 110 can be arranged to be spaced apart from each other in a matrix configuration having rows or columns and can be attached to carrier 10.

In some examples, pick-and-place equipment can pick up and place electronic components 110 on temporary bond layer 11 of carrier 10 and can be adhered to temporary bond layer 11. Electronic component 110 can have a substantially planar top surface (or a non-active region), a substantially bottom surface (or an active region) opposite to top surface, and side surfaces connecting top and bottom surfaces to each other. Bottom surface of electronic component 110 can be adhered to temporary bond layer 11 of carrier 10. Electronic component 110 can comprise at least one internal interconnects 111 on its bottom surface. Internal interconnects 111 can be adhered to temporary bond layer 11 of carrier 10. Internal interconnects 111 can be external input/output terminals of electronic component 110 and can comprise or be referred to as die pads or bond pads. Internal interconnects 111 can have a width in the range from approximately 2 μm (micrometers) to approximately 500 μm. Internal interconnects 111 can have a thickness in the range from approximately 3 μm to approximately 50 μm. Internal interconnects 111 can comprise an electrically conductive material, such as, for example, a metallic material, aluminum, copper, an aluminum alloy, or a copper alloy.

Electronic component 110 can comprise or be referred to as a semiconductor die, a semiconductor chip, or a semiconductor package or sub-package. In some examples, electronic component 110 can comprise at least one of an application specific integrated circuit, a logic die, a micro control unit, a memory, a digital signal processor, a network processor, a power management unit, an audio processor, an RF circuit, and a wireless baseband system on chip processor. Electronic component 110 can have a thickness in the range from approximately 0.01 mm (millimeter) to approximately 1 mm.

Carrier 10 can be a substantially planar plate. For example, carrier 10 can comprise or be referred to as a board, a wafer, a panel, a semiconductor or a strip. In some examples carrier 10 can comprise, for example steel, stainless steel, aluminum, copper, ceramic, glass, or a wafer. Carrier 10 can have a thickness in the range from approximately 0.5 mm to approximately 1.5 mm and a width in the range from approximately 200 mm to approximately 320 mm.

Carrier 10 can function to handle multiple elements in an integrated manner for attaching electronic component 110 and antenna elements 130, forming EMI shield 112 and forming encapsulant 140. Carrier 10 can be commonly applied to some examples of this disclosure.

Temporary bond layer 11 can be provided on a surface of carrier 10. Temporary bond layer 11 can be provided on surface of carrier 10 using a coating process, such as spin coating, doctor blade, casting, painting, spray coating, slot die coating, curtain coating, slide coating or knife over edge coating; a printing process, such as screen printing, pad printing, gravure printing, flexographic coating or offset printing; an inkjet printing process having intermediate features of coating and printing; or direct attachment of an adhesive film or an adhesive tape. Temporary bond layer 11 can comprise or be referred to as a temporary adhesive film or a temporary adhesive tape. Temporary bond layer 11 can be, for example, a thermally releasable tape (film) or a UV releasable tape (film), and is weakened or is removed by heat or UV irradiation in its bonding strength. In some examples, temporary bond layer 11 can have a weakened bonding strength or can be removed by physical or chemical external forces. Temporary bond layer 11 can have a thickness in the range from approximately 20 μm to approximately 500 μm. Temporary bond layer 11 can allow carrier 10 to be separated after encapsulant 140 to be described later is formed. Temporary bond layer 11 can be commonly applied to some examples of this disclosure.

Figure 2B:
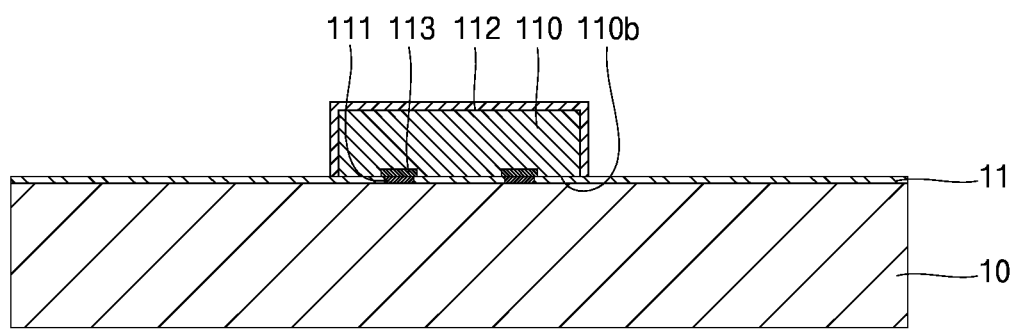

FIG. 2B shows semiconductor device 100 at a later stage of manufacture. In the example shown in FIG. 2B, EMI shield 112 can cover electronic component 110. EMI shield 112 can contact top and side surfaces of electronic component 110. EMI shield 112 can entirely cover top and side surfaces of electronic component 110 to a uniform thickness.

EMI shield 112 can be made of a conductive material so as to perform a function of shielding EMI induced from antenna elements 130 or externally induced to electronic component 110. In some examples, EMI shield 112 can comprise silver (Ag), copper (Cu), aluminum (Al), nickel (Ni), palladium (Pd) or chrome (Cr). In some examples, EMI shield 112 can be formed by sputtering, spraying, coating or plating. In some examples, a cap-shaped metal lid can be used as EMI shield 112. EMI shield 112 can have a thickness in the range from approximately 0.1 μm to approximately 10 μm.

Figure 2C:
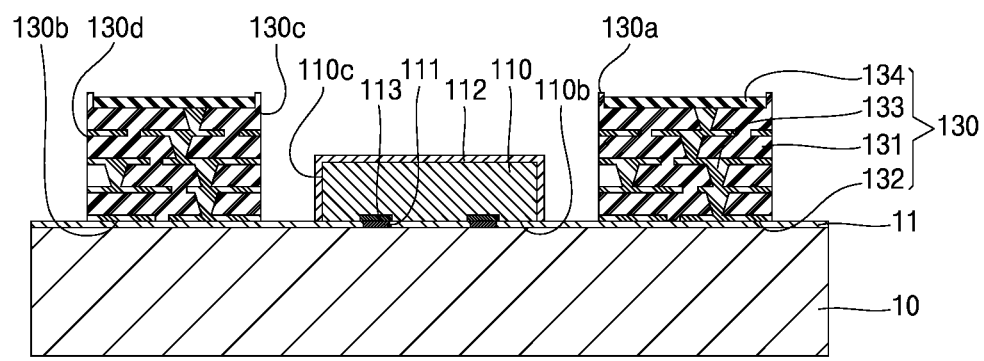

FIGS. 2C and 3 show semiconductor device 100 at a later stage of manufacture. In the example shown in FIG. 2C, bottom surfaces 130b of antenna elements 130 can be adhered to temporary bond layer 11 provided on carrier 10.

In some examples, pick-and-place equipment can pick up antenna elements 130 to place on a surface of temporary bond layer 11 of carrier 10 and can be adhered. In some examples, antenna elements 130 can be configured such that two antennas are adhered onto carrier 10 so as to be positioned at opposite sides of electronic component 110. Inner surfaces 130c of antenna elements 130 can be spaced apart from side surfaces 110c of electronic component 110 having EMI shield 112. Here, inner surfaces 130c of antenna elements 130 can face side surfaces 110c of electronic component 110, and outer surfaces 130d of antenna elements 130 can face outward so as to be opposite to inner surfaces 130c of antenna elements 130. Antenna elements 130 can extend parallel to side surfaces 110c of electronic component 110. Antenna elements 130 can comprise a length in the range from approximately 0.01 mm to approximately 20 mm. Antenna elements 130 can comprise a width in the range from approximately 0.01 mm to approximately 20 mm. Each of antenna elements 130 can have a thickness or height in the range from approximately 0.01 mm to approximately 1 mm. In some examples, antenna elements 130 can comprise or be referred to as antenna substrates, antenna modules, or antenna blocks.

Antenna elements 130 can comprise dielectric structure 131 having substantially planar top and bottom surfaces, conductive structures 132 and 133 exposed to inside and bottom surface of dielectric structure 131, and antenna patterns 134 exposed to top surface of dielectric structure 131. Conductive structures 132 and 133 can comprise conductive patterns or terminals 132 exposed to bottom surface of dielectric structure 131, and conductive path 133 formed inside dielectric structure 131. In some examples, antenna elements 130 can be configured such that one or more of dielectric structure 131 and conductive path 133 are sequentially stacked vertically.

In some examples, dielectric structure 131 can have substantially planar top and bottom surfaces. In some examples, dielectric structure 131 can comprise or be referred to as one or more dielectric layers, dielectrics, dielectric materials, insulating layers, or insulating materials. In some examples, dielectric structure 131 can comprise epoxy resin, phenol resin, glass epoxy, polyimide, polyester, epoxy molding compound, glass, or ceramic. Dielectric structure 131 can be configured such that one or more dielectric layers are upwardly stacked. Dielectric structure 131 can make antenna elements 130 maintained at a substantially planar state.

Conductive terminals 132 can be exposed through bottom surface of dielectric structure 131. Conductive terminals 132 can have one or more patterns. Conductive terminals 132 can be electrically connected to at least one conductive path 133. Each of conductive terminals 132 can comprise or be referred to as a conductor, a conductive material, an antenna land, a conductive land, an antenna pad, a wiring pad, a connection pad, a micro pad, a trace or an under-bump-metallurgy (UBM). In some examples, conductive terminals 132 can comprise copper, iron, nickel, gold, silver, palladium or tin.

Conductive path 133 can pass through dielectric structure 131 to then electrically connect conductive terminals 132 with antenna patterns 134. In some examples, conductive path 133 can comprise or be referred to as a conductor, a conductive material, a conductive via, a conductive path, a conductive trace, a conductive pattern, a conductive layer, a redistribution layer, or a circuit pattern. Conductive path 133 can be configured such that one or more conductive layers are upwardly stacked using a variety of patterns. In some examples, conductive path 133 can comprise copper, iron, nickel, gold, silver, palladium or tin.

Antenna patterns 134 can be exposed through top surface 130a of dielectric structure 131 so as to enable communication. Antenna patterns 134 can have one or more patterns. Antenna patterns 134 can be electrically connected to at least one conductive path 132. In some examples, each of antenna patterns 134 can comprise or be referred to as a dipole antenna, a monopole antenna, a patch antenna, a loop antenna, a beam antenna, a doublet antenna, a folded antenna, a rhombic antenna or a half wave antenna. In some examples, antenna patterns 134 can comprise copper, gold or silver.

Antenna elements 130 can vertically transmit/receive signals using antenna patterns 134 positioned on upper portions of antenna elements 130. Such antenna elements 130 can be vertical antennas. Antenna elements 130 can be varied in various manners in view of structure and layout. In the following discussion, example antenna elements and example layout of antenna elements that can be varied in various manners will be described.

Figure 4A:
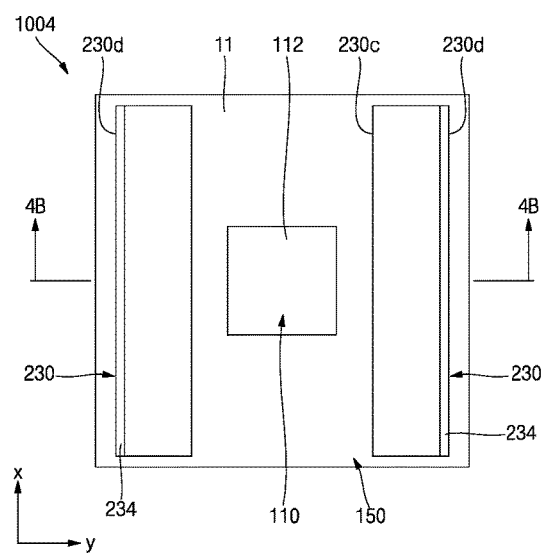
FIGS. 4A and 4B show a plan view and a cross-sectional view of example antenna elements and an example layout of antenna elements, which can be applied to an example method for manufacturing an example semiconductor device.
Figure 4B:
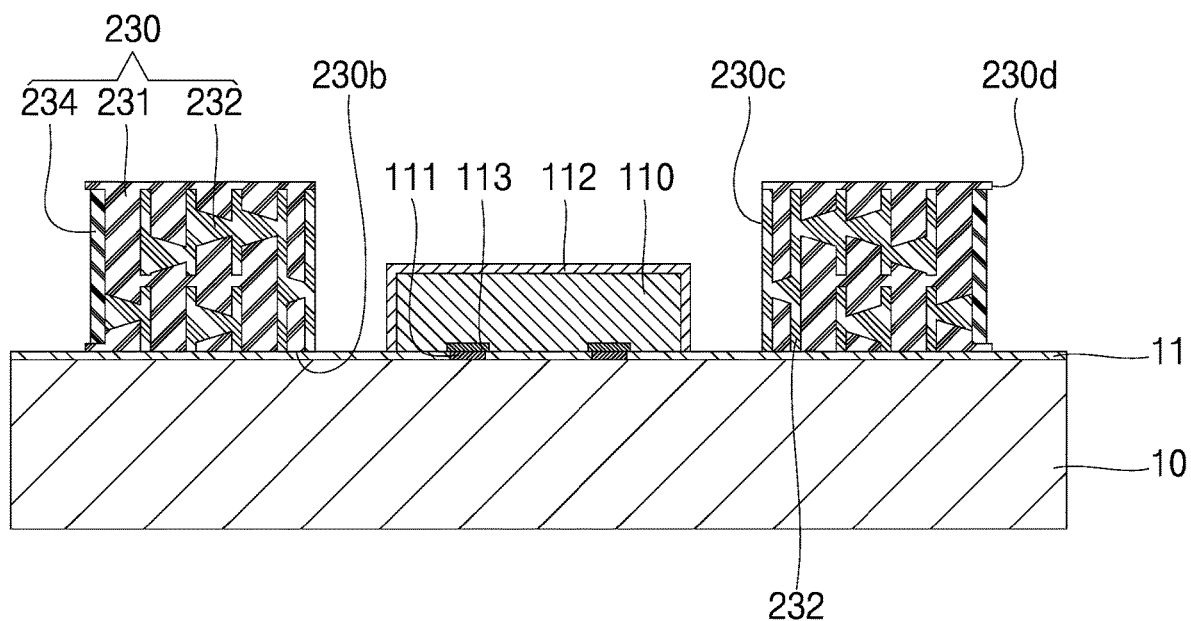

FIGS. 4A and 4B show views of example antenna element layout, with cross-sectional view taken along line 4B-4B in FIG. 4A, that can be applied to an example method for manufacturing an example semiconductor device such as semiconductor device 100 or semiconductor device 1004. In some examples, antenna elements 230 can be similar to antenna elements 130, but can be oriented in differently. In the examples shown in FIGS. 4A and 4B, two antenna elements 230 can be coupled with carrier 10 or substrate 150 so as to be positioned at opposite sides of electronic component 110, like antenna elements 130 shown in FIGS. 2C and 3. In some examples, antenna elements 230 can be arranged in similar manner to antenna elements 130 shown in FIG. 2C. In some examples, antenna elements 230 can be configured such that one or more of each of dielectric structure 231 and conductive structure 232 are sequentially stacked, whether inwards, outwards, or upwards.

Each of antenna elements 230 can comprise dielectric structure 231 having substantially planar top and bottom surfaces, conductive structure 232 formed inside dielectric structure 231 and exposed to a portion of bottom surface 230b of dielectric structure 231, and antenna patterns 234 exposed to outer surface 230d of dielectric structure 231.

In some examples, dielectric structure 231 can be similar to dielectric structure 131 shown in FIGS. 2C and 3. Dielectric structure 231 can be configured such that one or more dielectric layers are stacked along y-axis.

Conductive structure 232 can be formed inside dielectric structure 131 and can be exposed to bottom surface 230b of dielectric structure 231. Conductive structure 232 can be electrically connected to antenna patterns 134 and can be exposed to bottom surface 230b of dielectric structure 231. In some examples, conductive structure 232 can comprise or be referred to as a conductor, a conductive material, a conductive via, a conductive path, a conductive trace, a conductive pattern, a conductive layer, a redistribution layer (RDL), or a circuit pattern. Conductive structure 232 can be configured such that one or more conductive layers are stacked from inner surface 230c to outer surface 230d using a variety of patterns. In some examples, conductive path 232 can comprise copper, iron, nickel, gold, silver, palladium or tin.

Antenna patterns 234 can be exposed through outer surface 230a of dielectric structure 231 so as to enable communication. Antenna patterns 234 can be formed on outer surface 230a of dielectric structure 231 so as to have one or more patterns. Antenna patterns 234 can be electrically connected to at least one conductive structure 232. In some examples, each of antenna patterns 234 can comprise or be referred to as a dipole antenna, a monopole antenna, a patch antenna, a loop antenna, a beam antenna, a doublet antenna, a folded antenna, a rhombic antenna or a half wave antenna. In some examples, antenna patterns 234 can comprise copper, gold or silver.

Antenna elements 230 can outwardly transmit/receive signals using antenna patterns 234 positioned on outer surfaces 230d of antenna elements 230. Such antenna elements 230 can be horizontal antennas.

Figure 5A:
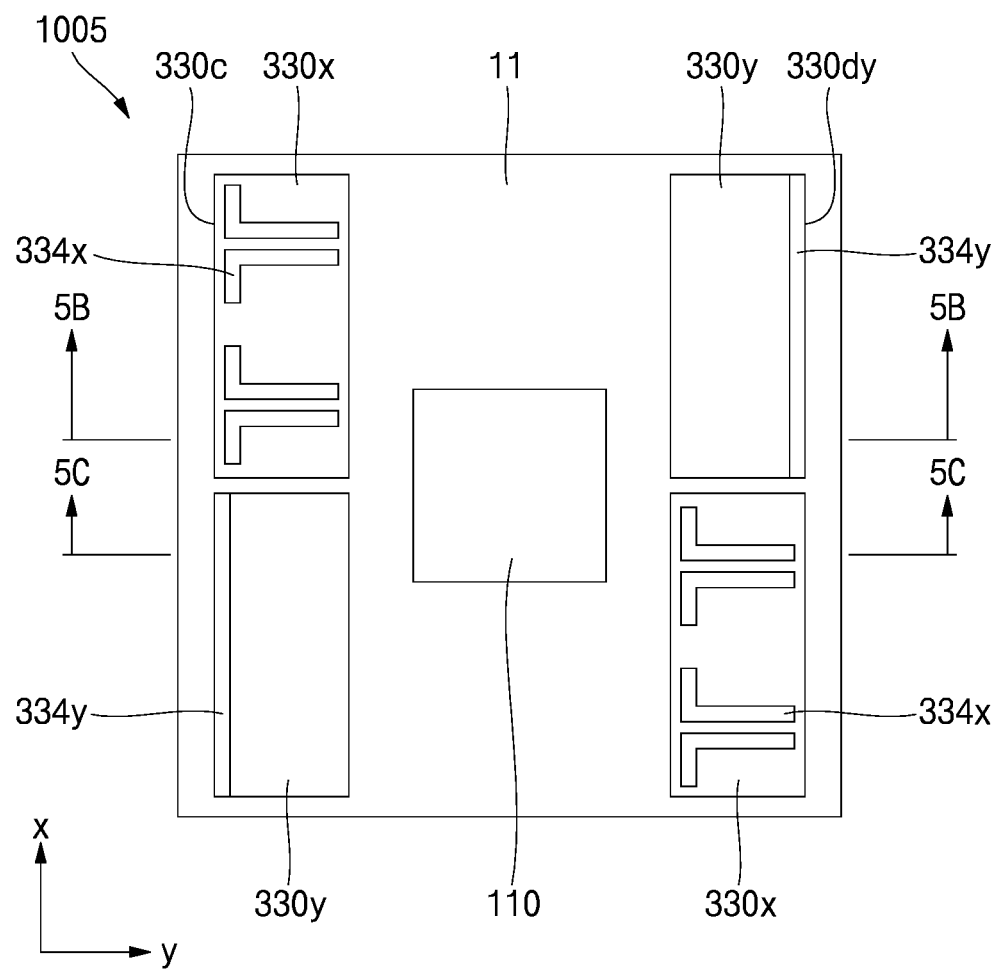
FIGS. 5A to 5C show a plan view and cross-sectional views of example antenna elements and an example layout of antenna elements, which can be applied to an example method for manufacturing an example semiconductor device.
Figure 5B:
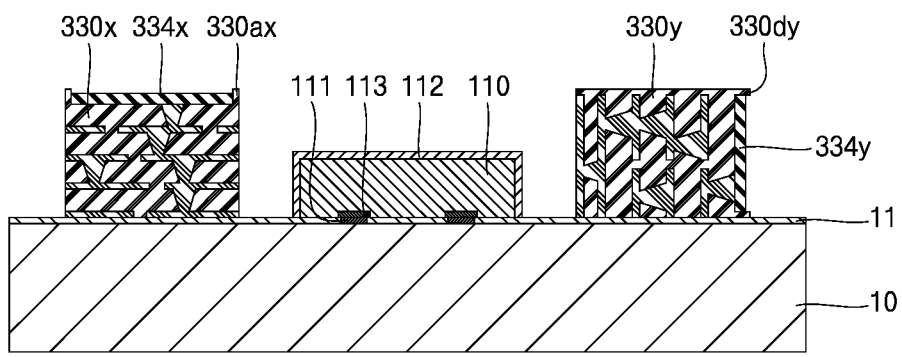
Figure 5C:
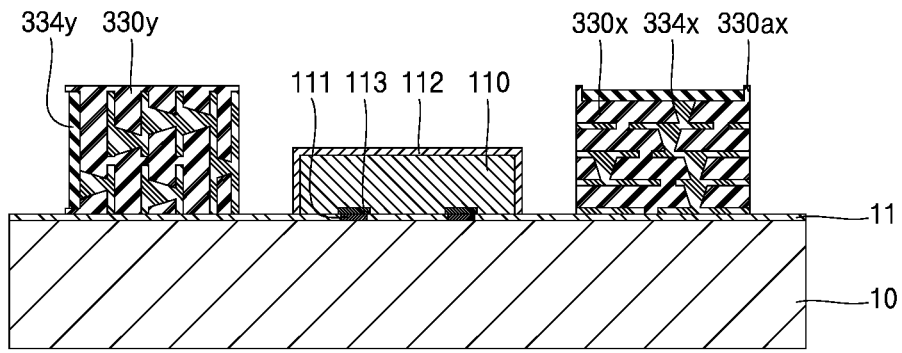

FIGS. 5A, 5B and 5C show views of example antenna element layout, with cross-sectional views taken along the lines 5B-5B and 5C-5C in FIG. 5A, that can be applied to an example method for manufacturing example semiconductor device such as semiconductor device 100 or semiconductor device 1005. In the example shown in FIGS. 5A to 5C, four antenna elements 330 can be coupled with carrier 10 or substrate 150 such that two antennas are positioned at opposite sides of electronic component 110. Antenna elements 330 can comprise two vertical antennas 330x having antenna patterns 334x similar to antenna elements 130 shown in FIGS. 2C and 3, and two horizontal antennas 330y having antenna patterns 334y similar to antenna elements 230 shown in FIGS. 4A and 4B. Vertical antennas 330x can be similar to antenna elements 130 shown in FIGS. 2C and 3, and horizontal antennas 330y can be similar to antenna elements 230 shown in FIGS. 4A and 4B Antenna elements 330 can vertically transmit/receive signals using vertical antennas 330x having antenna patterns 334x positioned on upper portions of antenna elements 330 and can laterally transmit/receive signals using horizontal antennas 330y having antenna patterns 334y positioned on outer surfaces of the horizontal antennas 330y.

Antenna elements 330 can be configured such that two antennas 330x and 330y having different orientations are lengthwise arranged at one side of electronic component 110, and two antennas 330x and 330y having different orientations are lengthwise arranged at the other side of electronic component 110.

Each of antennas 330x and 330y can extend a length in the range from approximately 0.01 mm to approximately 20 mm. Each of antennas 330x and 330y can extend a width in the range from approximately 0.01 mm to approximately 20 mm. Each of antennas 330x and 330y can have a thickness or height in the range from approximately 0.01 mm to approximately 1 mm. In some examples, each of antenna elements 330 can comprise or be referred to as an antenna substrate, an antenna module, or an antenna block.

Figure 6A:
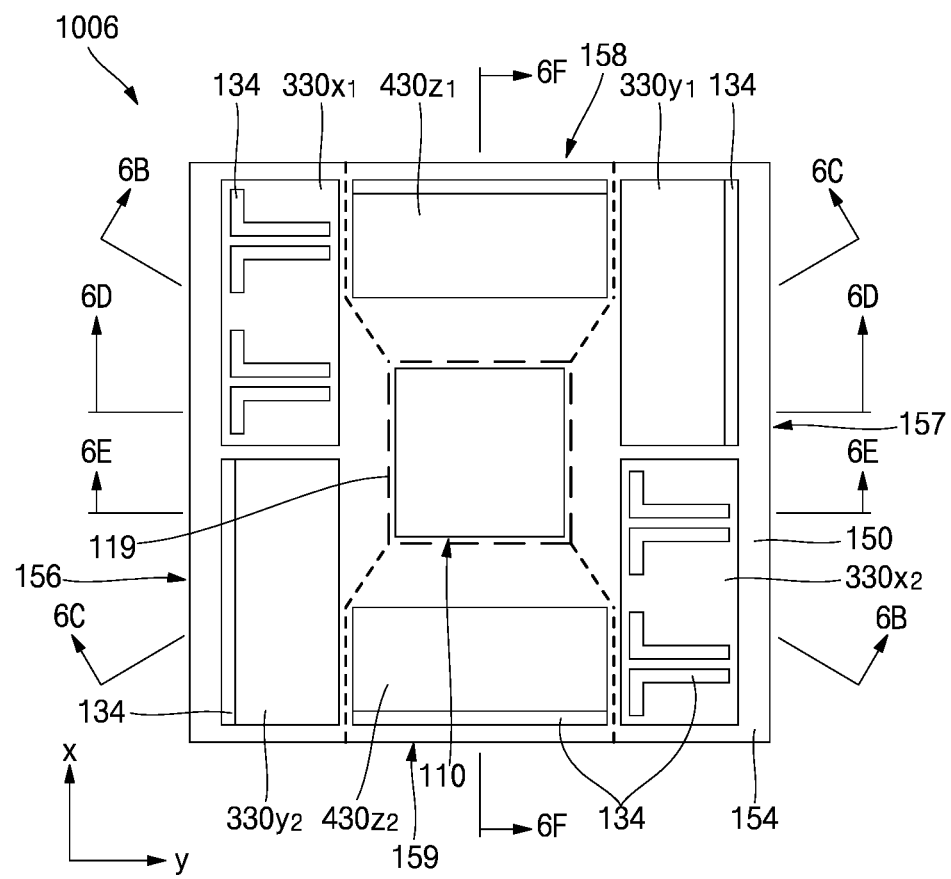
FIGS. 6A to 6F show a plan view and cross-sectional views of example antenna elements and an example layout of antenna elements, which can be applied to an example method for manufacturing an example semiconductor device.

FIGS. 6A, 6B, 6C and 6D show views of example antenna element layout, with cross-sectional views taken along lines 6B-6B, 6C-6C, and 6D-6D in FIG. 6A, that can be applied to an example method for manufacturing example semiconductor device such as semiconductor device 100 or semiconductor device 1006. In the example shown in FIGS. 6A to 6D, six antenna elements can be coupled with carrier 10 or substrate 150 such that antenna elements 330x and 330y are lengthwise arranged at first opposite sides of electronic component 110, like in the layout of antenna elements 330 shown in FIGS. 5A, 5B and 5C, and antenna elements 430z are lengthwise arranged at second opposite sides of electronic component 110.

Antenna elements 330 can comprise vertical antenna elements 330x having antenna patterns 334 at element head side 135 facing one or more vertical directions, and two horizontal antennas 330y having antenna patterns 334 at element head side 135 facing respective rightward and leftward horizontal directions, similar to antenna elements 330 shown in FIGS. 5A to 5C. Antenna elements 430 can comprise horizontal antenna elements 430z having antenna patterns 134 at element head side 135 facing respective upward and downward horizontal directions.

Vertical antennas 330x can be configured in similar manner with antenna elements 130 shown in FIGS. 2C and 3, and horizontal antennas 330y and 430z can be configured in similar manner with antenna elements 230 shown in FIGS. 4A and 4B.

The antenna elements of semiconductor device 1006 can vertically transmit/receive signals using vertical antenna elements 330x, and can horizontally transmit/receive signals using horizontal antenna elements 330y and 430z. In some examples, individual antenna elements 330x, 330y, 430z can all be similar to antenna element 130 or similar to each other. In some examples, antenna elements 330x, 330y, 430z can differ from each other mainly by being oriented in different directions when coupled with carrier 10 or substrate 150.

In addition to the configurations and layouts of antenna elements 130, 230, 330, and 430 shown in FIGS. 2C, 3, 4A, 4B, 5A to 5C and 6A to 6D, antenna elements can be varied in view of configuration and layout by arranging vertical antennas or horizontal antennas similar to those described in various manners.

Figure 2D:
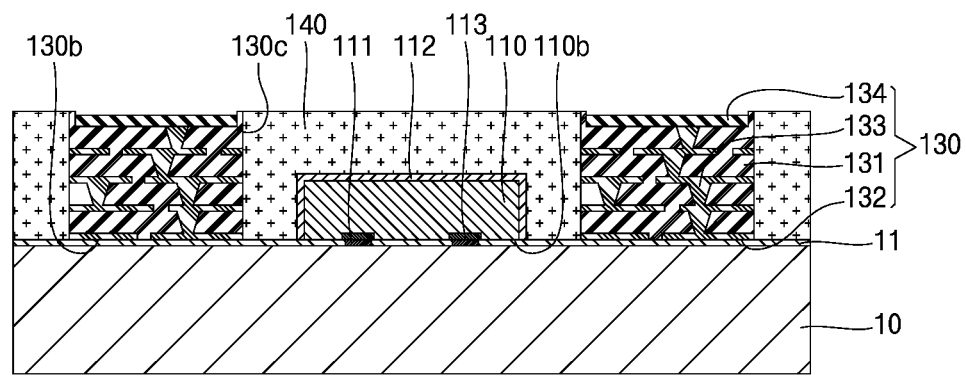

FIG. 2D shows semiconductor device 100 at a later stage of manufacture. In the example shown in FIG. 2D, encapsulant 140 can cover carrier 10, electronic component 110, and antenna elements 130. In some examples, encapsulant 140 can be brought into contact with top surface of temporary bond layer 11 of carrier 10, outer surface of EMI shield 112 of electronic component 110, and side surfaces of antenna elements 130. Here, antenna patterns 134 of antenna elements 130 can be exposed.

In some examples, encapsulant 140 can comprise or be referred to as epoxy molding compound, epoxy molding resin or sealant. In some examples, encapsulant 140 can comprise or be referred to as a molding part, a sealing part, an encapsulation part, a protection part, a package or a body. In some examples, encapsulant 140 can comprise, an organic resin, an inorganic filler, a curing agent, a catalyst, a coupling agent, a coloring agent, and a flame retardant. Encapsulant 140 can be formed by any of a variety of processes. In some examples, encapsulant 140 can be formed using, compression molding, transfer molding, liquid-phase encapsulant molding, vacuum lamination, paste printing or film assist molding. Encapsulant 140 can have a thickness in the range from approximately 0.1 mm to approximately 2 mm. Encapsulant 140 can cover electronic component 110 and antenna elements 130 to protect electronic component 110 and antenna elements 130 from external elements or environmental exposure.

Figure 2E:
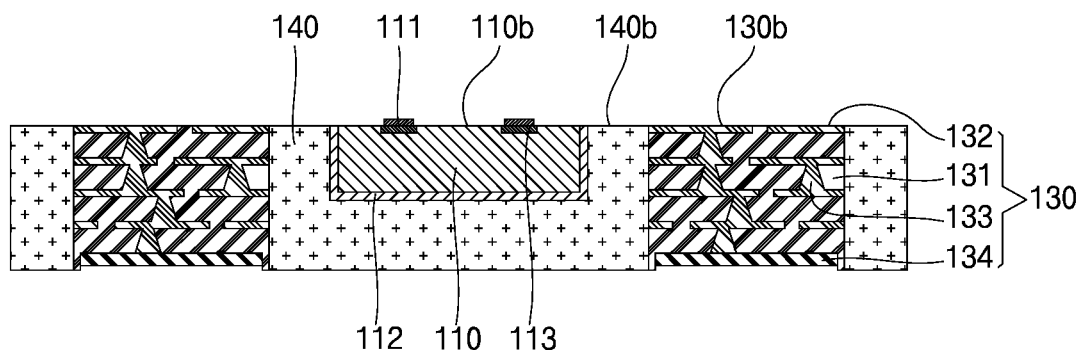

FIG. 2E shows semiconductor device 100 at a later stage of manufacture. In the example shown in FIG. 2E, semiconductor device 100 can be flipped to remove carrier 10 in a state in which carrier 10 is positioned on electronic component 110, antenna elements 130, and encapsulant 140. If semiconductor device 100 is flipped in such a manner, antenna patterns 134 of antenna elements 130 can be positioned on a bottom surface of semiconductor device 100.

Carrier 10 can be removed from top surface 110b of electronic component 110, top surfaces 130b of antenna elements 130, and top surface 140b of encapsulant 140. Temporary bond layer 11 can be removed from electronic component 110, antenna elements 130, and encapsulant 140 in a state in which temporary bond layer 11 is adhered to carrier 10. In some examples, heat, light, a chemical solution or physical force can be formed to temporary bond layer 11, thereby removing or reducing bonding strength of temporary bond layer 11. Accordingly, top surface 110b of electronic component 110, top surfaces 130b of antenna elements 130, and top surface 140b of encapsulant 140, can be exposed. Internal interconnects 111 of electronic component 110 and conductive terminals 132 of antenna elements 130 can also be exposed.

Figure 2F:
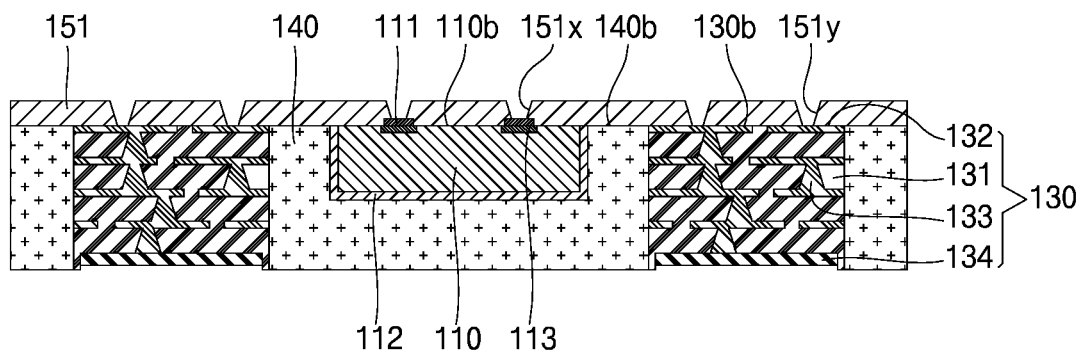

FIG. 2F shows semiconductor device 100 at a later stage of manufacture. In the example shown in FIG. 2F, dielectric structure 151 can be formed on top surface 110b of electronic component 110, top surfaces 130b of antenna elements 130, and top surface 140b of encapsulant 140, and can be patterned, thereby exposing internal interconnects 111 and conductive terminals 132.

Dielectric structure 151 can have a uniform thickness so as to cover top surface 110b of electronic component 110, top surfaces 130b of antenna elements 130, and top surface 140b of encapsulant 140. Apertures 151x and 151y exposing internal interconnects 111 of electronic component 110 and conductive terminals 132 of antenna elements 130, can be formed in dielectric structure 151.

Dielectric structure 151 can comprise or be referred to as dielectrics, a dielectric material, a dielectric layer, a passivation layer, an insulating layer, or a protection layer. In some examples, dielectric structure 151 can comprise, an electrically insulating material, such as, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric structure 151 can be formed by any of a variety of processes. Dielectric structure 151 can be formed by, for example, spin coating, spray coating, printing, PVD, CVD, MOCVD, ALD, LPCVD, or PECVD. Dielectric structure 151 can have a thickness in the range from approximately 5 μm to approximately 50 μm.

For example, a mask pattern can be formed on top surface of dielectric structure 151 and exposed dielectric structure 151 can be removed by etching, thereby forming apertures 151x and 151y. Apertures 151x and 151y can comprise or be referred to as openings or holes. Dielectric structure 151 can expose top surfaces of internal interconnects 111 of electronic component 110 through apertures 151x, and top surfaces of conductive terminals 132 of antenna elements 130 through apertures 151y. For example, photoresist can be used as the mask pattern.

Figure 2G:
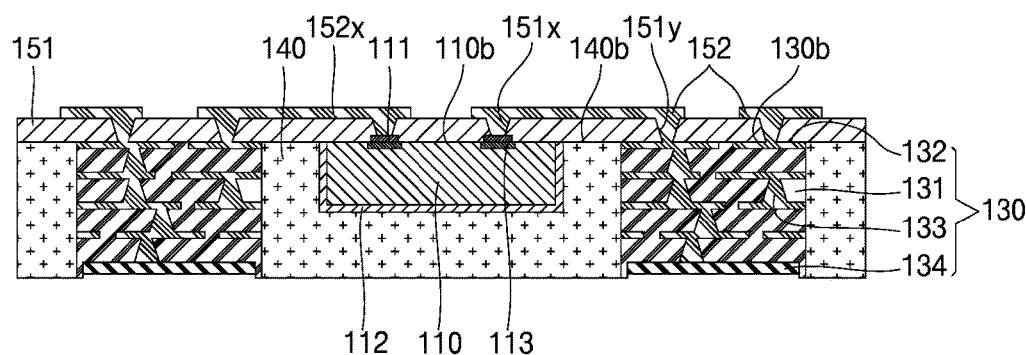

FIG. 2G shows semiconductor device 100 at a later stage of manufacture. In the example shown in FIG. 2G, conductive structure 152 can cover top surface of dielectric structure 151, and internal interconnects 111 of electronic component 110 and conductive terminals 132 of antenna elements 130, exposed through apertures 151x and 151y.

Conductive structure 152 can have multiple patterns, and are brought into contact with internal interconnects 111 of electronic component 110 and conductive terminals 132 of antenna elements 130, exposed through apertures 151x and 151y, respectively, and can be electrically connected. Conductive structure 152 can comprise conductors 152x electrically connecting internal interconnects 111 of electronic component 110 and conductive terminals 132 of antenna elements 130 with each other. Conductors 152x can extend from a point over electronic component 110 to a point over each of antenna elements 130 to electrically connect electronic component 110 and antenna elements 130.

In some examples, conductive structure 152 can comprise or be referred to as conductors, a conductive material, a conductive layer, a redistribution layer (RDL), a wiring pattern, a trace pattern, or a circuit pattern. In some examples, conductive terminals 132 can comprise copper, iron, nickel, gold, silver, palladium or tin. In some examples, one or more conductors 152x can comprise or be referred to as traces, terminals, pads, vias, conductive patterns, conductive layers, or conductive paths, and can extend both within and beyond the footprint of electronic component 110. In some examples, conductive structure 152 can be formed using, for example, any of a variety of conductive materials (e.g., copper, gold, silver, or equivalents). Conductive structure 152 can be formed by any of a variety of processes (e.g., sputtering, electroless plating, electroplating, PVD, CVD, MOCVD, ALD, LPCVD, PECVD, or equivalents). Conductive structure 152 can be formed to have a uniform thickness so as to cover top surface of dielectric structure 151, internal interconnects 111 of electronic component 110 and conductive terminals 132 of antenna elements 130, exposed through apertures 151x and 151y, and can have multiple patterns by patterning the same using a mask pattern. Conductive structure 152 can have a thickness in the range from approximately 3 μm to approximately 50 μm.

Figure 2H:
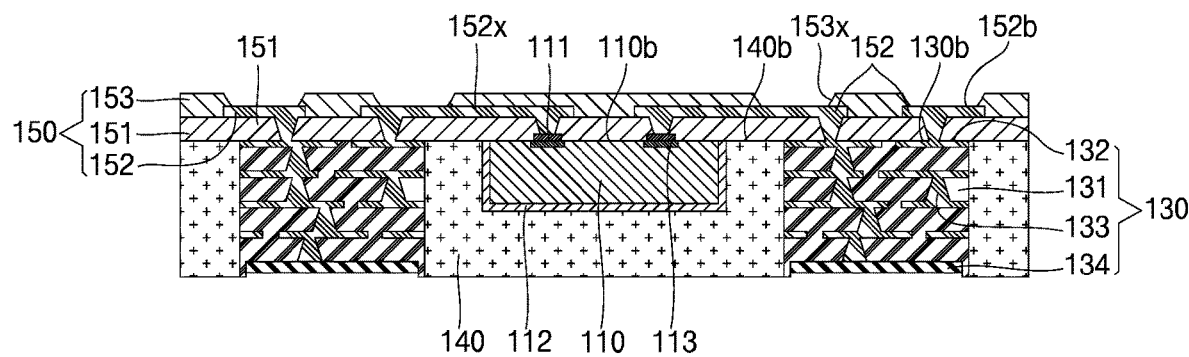

FIG. 2H shows semiconductor device 100 at a later stage of manufacture. In the example shown in FIG. 2H, dielectric structure 153 can cover dielectric structure 151 and conductive structure 152 to a uniform thickness. Apertures 153x exposing top surface 152b of conductive structure 152 can be formed in dielectric structure 153. Dielectric structure 153 can also expose top surfaces of conductors 152x through apertures 153x. Dielectric structure 153 can be similar to, and can be similarly formed as, dielectric structure 151.

Although only two dielectric structures 151 and 153 and one conductive structure 152 are shown in substrate 150, this is not a limitation of the present disclosure. In some examples, the number of structures that make up substrate 150 can be smaller or greater than that shown in the present disclosure.

Substrate 150 is presented as a redistribution layer ("RDL") substrate in the present example. RDL substrates can comprise one or more conductive redistribution layers and one or more dielectric layers that (a) can be formed layer by layer over an electronic component to which the RDL substrate is to be electrically coupled, or (b) can be formed layer by layer over a carrier that can be entirely removed or at least partially removed after the electronic component and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic component, or (b) fan-in electrical traces within the footprint of the electronic component. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bis-maleimide triazine (BT) or FR4 and these types of RDL substrates can comprise or be referred to as a coreless substrate. Other substrates in this disclosure can also comprise an RDL substrate.

In some examples, substrate 150 can be a pre-formed substrate. The pre-formed substrate can be manufactured prior to attachment to an electronic component and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic component. The pre-formed substrate can referred to as a printed circuit board (PCB) or a laminate substrate. Such pre-formed substrate can be formed through a semi-additive or modified-semi-additive process. Other substrates in this disclosure can also comprise a pre-formed substrate.

Figure 2I:
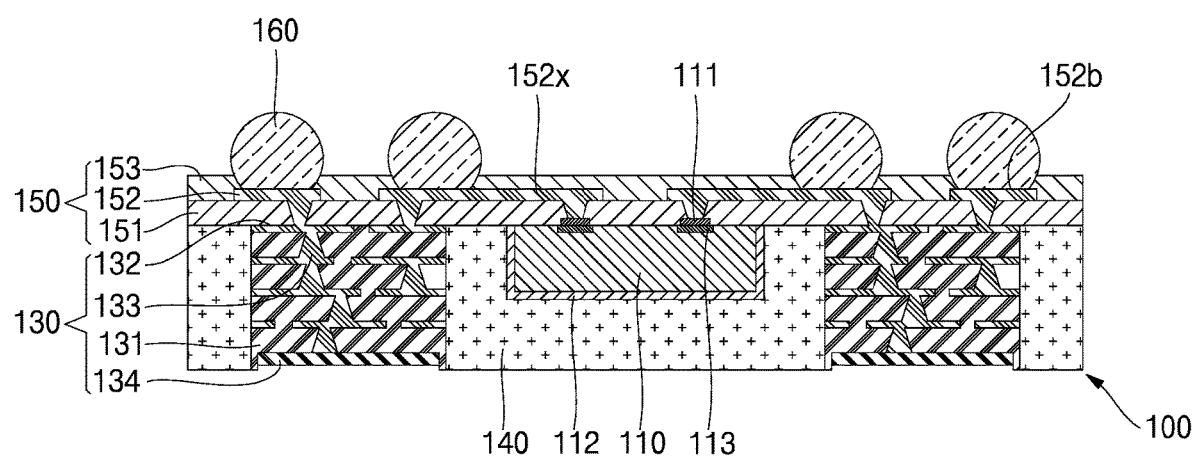

FIG. 2I shows semiconductor device 100 at a later stage of manufacture. In the example shown in FIG. 2I, external interconnects 160 can be formed on top surface 152b of conductive structure 152.

External interconnects 160 can be electrically connected to top surface 152b of conductive structure 152. External interconnects 160 can be electrically connected to electronic component 110 or to antenna elements 130 through substrate 150. External interconnects 160 can be electrically connected to both of electronic component 110 and antenna elements 130 through conductors 152x of substrate 150.

In some examples, external interconnects 160 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnects 160 can be formed using, for example, a ball drop process, a screen printing process or an electroplating process. For example, external interconnects 160 can be formed by preparing a conductive material containing a solder on top surface 152b of conductive structure 152 of substrate 150 using a ball drop process, followed by a reflow process. External interconnects 160 can comprise or be referred to as conductive balls, such as solder balls, conductive pillars, such as copper pillars, or conductive posts having solder caps on copper pillars. External interconnects 160 can have a size in the range from approximately 0.01 mm to approximately 1 mm. Completed semiconductor device 100 can be flipped, so that external interconnects 160 are positioned on bottom surface 100y of semiconductor device 100.

The method presented throughout FIG. 2 can be used to finalize different semiconductor devices, such as those corresponding to the arrangements of FIGS. 4-6. For example, FIG. 6A shows a top view of semiconductor device 1006. FIGS. 6B-6F show side cross-sectional views of semiconductor device 1006 along different antenna elements 330x, 330y, 430z.

FIG. 6A shows several antenna elements are shown coupled with substrate 150 at substrate portions defined around footprint 119 of electronic component 110 or around a center of the antenna elements arrangement, such substrate portions shown divided by dotted lines. Antenna element 330x1 is shown coupled to substrate leftward portion 156, antenna element 330x2 is shown coupled to substrate rightward portion 157, antenna element 330y1 is shown coupled to substrate rightward portion 157, antenna element 330y2 is shown coupled to substrate leftward portion 156, antenna element 430z1 is shown coupled to substrate upward portion 158, and antenna element 430z2 is shown coupled to substrate downward portion 159.

Substrate 150 comprises a substrate dielectric structure having one or more dielectric layers, such as dielectric layers 151, 153, between substrate top side 154 and substrate bottom side 155. Substrate 150 also comprises substrate conductive structure 152 comprising one or more conductors, conductive layers, pads, vias, or traces, that traverse the substrate dielectric structure horizontally or vertically. Substrate conductive structure 152 can comprise substrate terminal 1521, and can comprise substrate terminal 1522 exposed at substrate top side 154. In some examples, substrate terminals 1521, 1522 can comprise or be referred to as pads, vias, or traces.

Electronic component 110 can be coupled to substrate 150 and can comprise component terminal 115 coupled to substrate terminal 1521. In some examples, component terminals 115 can comprise or be referred to as pads, bumps, or pillars. In some examples, component side 117 of electronic component 110 can directly contact substrate top side 154. In some examples, such as when component terminal 115 comprises a bump or pillar, component side 117 of electronic component 110 can be distanced from substrate top side by a gap defined by height of component terminal 115.

In some examples, footprint 119 shown in FIG. 6A can represent the area of substrate 150 covered by electronic component 110, whether electronic component 110 is coupled to substrate top side 154 as shown and described for example with respect to FIGS. 1-2, or whether electronic component 110 is coupled to substrate bottom side 155 as shown and described for example further below with respect to corresponding elements in FIGS. 11-16.

Semiconductor device 1006 can comprise one or more passive components coupled to substrate 150. In some examples, the passive components can be similar in terms of features or location to the passive components 520 or 720 described further below with respect to FIGS. 7-10 or FIGS. 14-16. In some examples, one or more of the passive components can be coupled to substrate 150 at least partially within footprint 119 of electronic component 110, whether such passive component is on substrate bottom side 155 and electronic component 110 is on substrate top side 154, or whether such passive component is on substrate top side 154 and electronic component 110 is on substrate bottom side 155. In some examples one or more of the passive components can be coupled to substrate upward portion 158, whether at substrate top side 154 or substrate bottom side 155, between antenna element 330x1 and antenna element 330y1, adjacent to antenna element 430z1, or adjacent electronic component 110. In some examples one or more of the passive components can be coupled to substrate downward portion 159, whether at substrate top side 154 or substrate bottom side 155, between antenna element 330y2 and antenna element 330x2, adjacent to antenna element 430z2, or adjacent electronic component 110. In some examples one or more of the passive components can be coupled to substrate leftward portion 156, whether at substrate top side 154 or substrate bottom side 155, between antenna element 430z1 and antenna element 430z2, adjacent to antenna element 330x1 or antenna element 330y2, or adjacent electronic component 110. In some examples one or more of the passive components can be coupled to substrate rightward portion 157, whether at substrate top side 154 or substrate bottom side 155, between antenna element 430z1 and antenna element 430z2, adjacent to antenna element 330y1 or antenna element 330x2, or adjacent electronic component 110.

Antenna elements 330x, 330y, 430z can comprise outward vertical surfaces facing horizontally outward of semiconductor device 1006, and inward vertical surfaces opposite the outward vertical surfaces. Depending on the antenna element, such outward vertical surfaces can correspond to element head side 135 or element sidewall 136, and such inward vertical surfaces can correspond to element base side 137 or element sidewall 136. Semiconductor device 1006 can comprise encapsulant 140 on substrate top side 154. In some examples, encapsulant 140 can cover the inward vertical surfaces of antenna elements 330x, 330y, or 430z. In some examples, encapsulant 140 can cover the outward vertical surfaces of antenna elements 330x, 330y, or 430z. In some examples, encapsulant 140 leave the outward vertical surfaces of antenna elements 330x, 330y, or 430z exposed. Encapsulant 140 can also cover component sidewall 116 or component side 115 of electronic component 110. In some examples, shield structure 112 can cover component sidewall 116 and component side 115, and encapsulant 140 can in turn cover shield structure 112 adjacent component sidewall 116 or adjacent component side 115. In some examples, encapsulant 140 can leave exposed shield structure 112 adjacent component side 115.

Figure 6B:
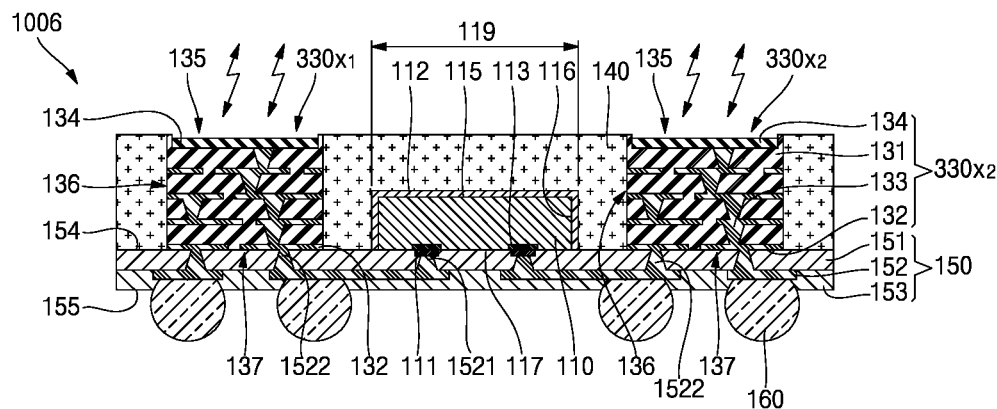

The cross-section presented in FIG. 6B corresponds to line 6B-6B of FIG. 6A and shows antenna element 330x1 and antenna element 330x2 coupled to substrate 150 outside component footprint 119 of electronic component 110. Antenna element 330x1 or antenna element 330x2 can be similar to antenna element 130 previously described. Antenna element 330x1 can be similar to antenna element 330x2, but can be coupled opposite each other. The arrangement, orientation, or features of antenna elements 330y1 and 330y2 can be similar to that described above with respect to antenna elements 130 in FIGS. 1-3.

As an example, antenna element 330x2 comprises element dielectric structure 131 comprising one or more dielectric layers, antenna pattern 134 coupled to element dielectric structure 131, and element terminal 132 coupled to substrate terminal 1522. Element terminal 132 can be part of conductive structure 133, which provides a conductive path or antenna path comprising one or more traces or vias that traverse element dielectric structure 131 for coupling antenna pattern 134 to element terminal 132. Antenna element 330x1 also comprises element head side 135 adjacent antenna pattern 134, element base side 137 opposite element head side 135, and element sidewall 136 between element head side 135 and element base side 137. In some examples, antenna pattern 134 can be exposed at or through element head side 134 for outbound or inbound wireless communications. In the present example, element terminal 132 is exposed at element base side 137, and antenna pattern 134 is coupled to substrate 150 through element terminal 132 and substrate terminal 1522. Substrate conductive structure 152 couples antenna element 330x2 to electronic component 110, providing a conductive path between element terminal 132 and component terminal 115.

Antenna pattern 134 can be configured or oriented to send or receive wireless communications along a direction substantially orthogonal to antenna head side 135 or antenna pattern 134. For antenna element 330x2, element head side 135 faces topward vertical direction, with antenna pattern 134 oriented for communication along such vertical direction, and with element base side 137 coupled to substrate 150. Similarly in the present example, antenna element 330x1 comprises element head side 135 facing topward vertical direction, with antenna pattern 134 oriented for communication along such vertical direction and with element base side 137 coupled to substrate 150. In some examples encapsulant 140 can cover element head side 135 or antenna pattern 134. In some examples, encapsulant 140 can be applied, or antenna element 330x1 or antenna element 330x2 can be positioned, such that element head side 135 or antenna pattern 134 remain exposed from encapsulant 140.

There can be examples, however, where one or both of antenna element 330x1 or antenna element 330x2 can be oriented such that antenna head side 135 faces a horizontal direction, for communication along such horizontal direction. In such examples, element sidewall 136 can be coupled to substrate 150, or element terminal 132 can be exposed at element sidewall 137 and coupled to substrate terminal 1522. There can be examples, where one of antenna element 330x1 or antenna element 330x2 can be oriented for topward vertical communication as described above, and where another one of antenna element 330x1 or antenna element 330x2 can be oriented such that antenna head side 135 faces a bottomward vertical direction for communication along such vertical direction.

Figure 6C:
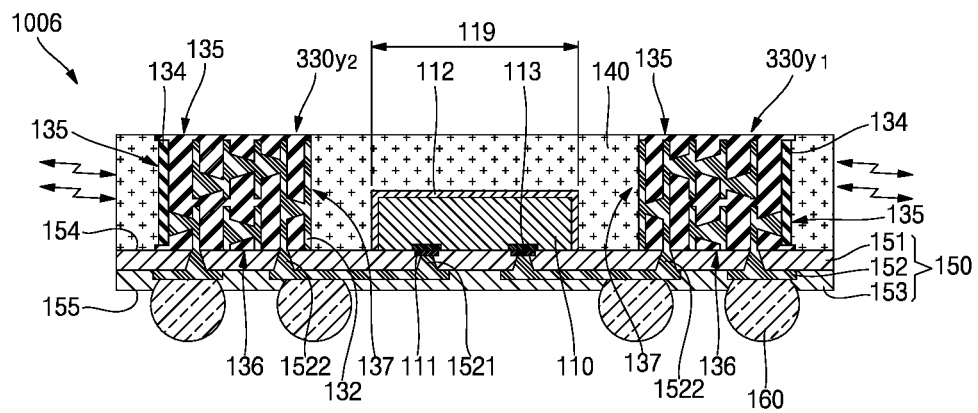

The cross-section presented in FIG. 6C corresponds to line 6C-6C of FIG. 6A and shows antenna element 330y1 and antenna element 330y2 coupled to substrate 150 outside component footprint 119 of electronic component 110. Antenna element 330$y1$ or antenna element 330$y2$ can be similar to antenna element 130 previously described. Antenna element 330$y1$ can be similar to antenna element 330$y2$, but can be coupled opposite each other. The arrangement, orientation, or features of antenna elements 330$y1$ and 330$y2$ can be similar to that described above with respect to antenna elements 230 in FIG. 4.

In the view of FIG. 6C, antenna element 330$y1$ comprises element head side 135 facing rightward horizontal direction, with antenna pattern 134 oriented for communication along such rightward horizontal direction, and with element sidewall 136 coupled to substrate 150. Antenna element 330$y2$ comprises element head side 135 facing leftward horizontal direction, with antenna pattern 134 oriented for communication along such leftward horizontal direction, and with element sidewall 136 coupled to substrate 150. In some examples encapsulant 140 can cover element head side 135 or antenna pattern 134. In some examples encapsulant 140 can cover element head side 135 or antenna pattern 134. In some examples, encapsulant 140 can be applied, or antenna element 330$y1$ or antenna element 330$y2$ can be positioned, such that element head side 135 or antenna pattern 134 remain exposed from encapsulant 140.

Figure 6D:
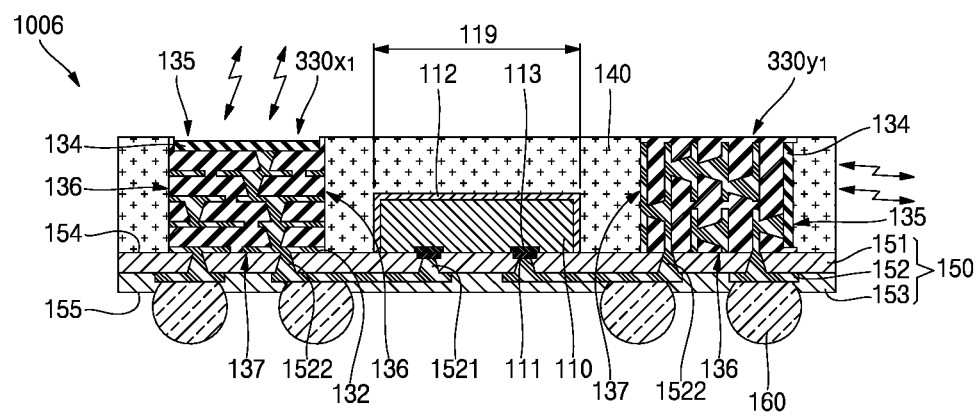

The cross-section shown in FIG. 6D corresponds to line 6D-6D of FIG. 6A and shows antenna element 330$x1$ and antenna element 330$y1$ coupled to substrate 150 outside component footprint 119 of electronic component 110. Antenna element 330$x1$ or antenna element 330$y1$ can be similar to antenna element 130 previously described. Antenna element 330$x1$ can be similar to antenna element 330$y1$, but can be coupled opposite each other or in a different orientation.

In the view of FIG. 6D, antenna element 330$x1$ comprises element head side 135 facing topward vertical direction, with antenna pattern 134 oriented for communication along such topward vertical direction, and with element base side 137 coupled to substrate 150. Antenna element 330$y1$ comprises element head side 135 facing rightward horizontal direction, with antenna pattern 134 oriented for communication along such rightward horizontal direction, and with element sidewall 136 coupled to substrate 150. In some examples encapsulant 140 can cover element head side 135 or antenna pattern 134. In some examples, encapsulant 140 can be applied, or antenna element 330$x1$ or antenna element 330$y1$ can be positioned, such that element head side 135 or antenna pattern 134 remain exposed from encapsulant 140.

Figure 6E:
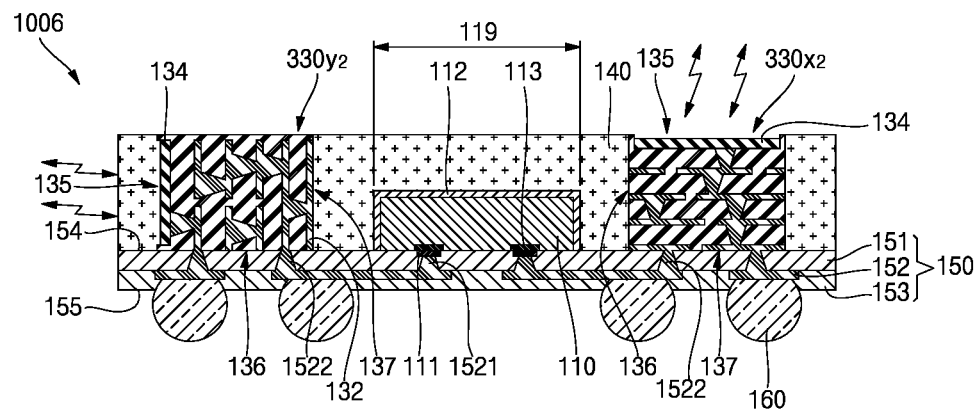

The cross-section shown in FIG. 6E corresponds to line 6E-6E of FIG. 6A and shows antenna element 330$y2$ and antenna element 330$x2$ coupled to substrate 150 outside component footprint 119 of electronic component 110. Antenna element 330$y2$ or antenna element 330$x2$ can be similar to antenna element 130 previously described. Antenna element 330$x2$ can be similar to antenna element 330$y2$, but can be coupled opposite each other or in a different orientation.

In the view of FIG. 6E, antenna element 330$y2$ comprises element head side 135 facing leftward horizontal direction, with antenna pattern 134 oriented for communication along such leftward horizontal direction, and with element sidewall 136 coupled to substrate 150. Antenna element 330$x2$ comprises element head side 135 facing topward vertical direction, with antenna pattern 134 oriented for communication along such topward vertical direction, and with element base side 137 coupled to substrate 150. In some examples encapsulant 140 can cover element head side 135 or antenna pattern 134. In some examples, encapsulant 140 can be applied, or antenna element 330$y2$ or antenna element 330$x2$ can be positioned, such that element head side 135 or antenna pattern 134 remain exposed from encapsulant 140.

Figure 6F:
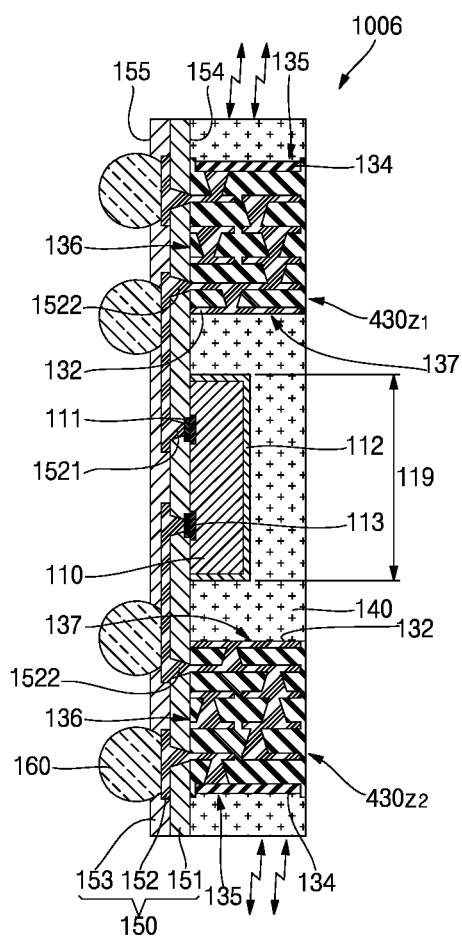

The cross-section shown in FIG. 6F corresponds to line 6F-6F of FIG. 6A and shows antenna element 430$z1$ and antenna element 430$z2$ coupled to substrate 150 outside component footprint 119 of electronic component 110. Antenna element 430$z1$ or antenna element 430$z2$ can be similar to antenna element 130 previously described. Antenna element 430$z1$ can be similar to antenna element 430$z2$, but can be coupled opposite each other or in a different orientation.

In the view of FIG. 6F, antenna element 430$z1$ comprises element head side 135 facing upward horizontal direction, with antenna pattern 134 oriented for communication along such upward horizontal direction, and with element sidewall 136 coupled to substrate 150. Antenna element 430$z2$ comprises element head side 135 facing downward vertical direction, with antenna pattern 134 oriented for communication along such downward vertical direction, and with element base side 137 coupled to substrate 150. In some examples encapsulant 140 can cover element head side 135 or antenna pattern 134. In some examples, encapsulant 140 can be applied, or antenna element 430$z1$ or antenna element 430$z2$ can be positioned, such that element head side 135 or antenna pattern 134 remain exposed from encapsulant 140.

Figure 7A:
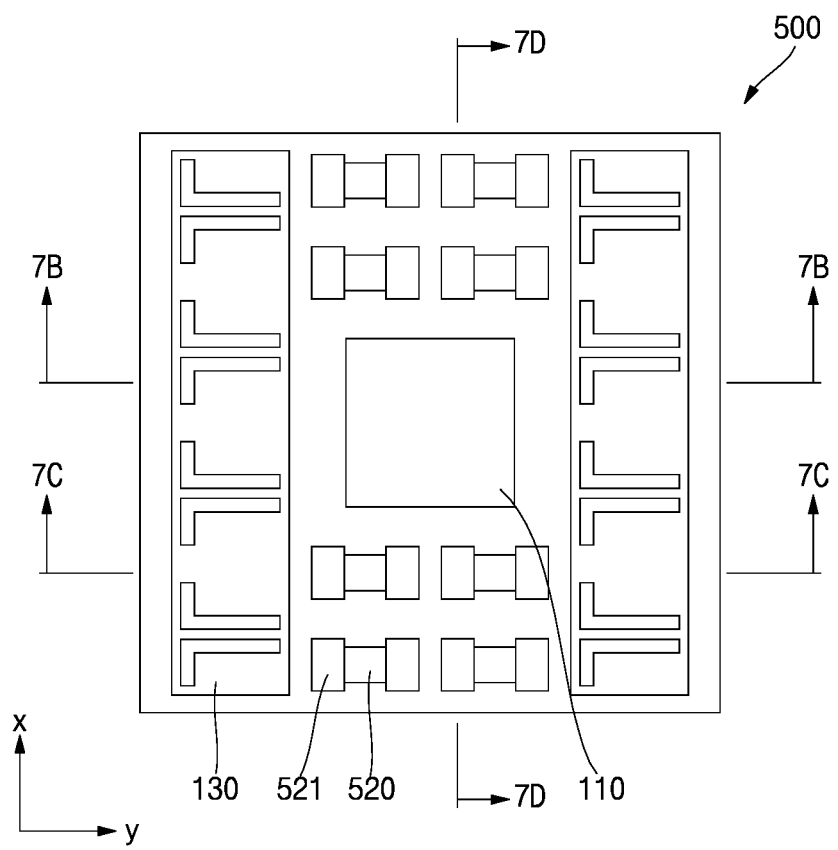
FIGS. 7A to 7D show a plan view and cross-sectional views of an example semiconductor device.
Figure 7B:
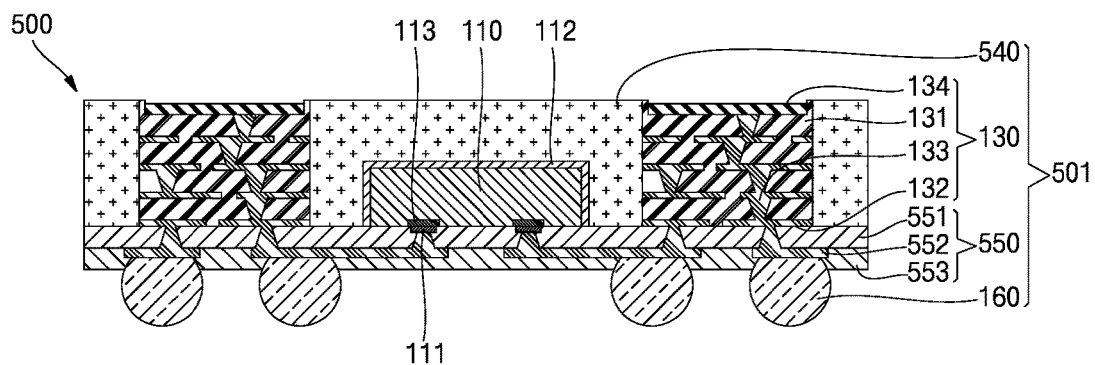
Figure 7C:
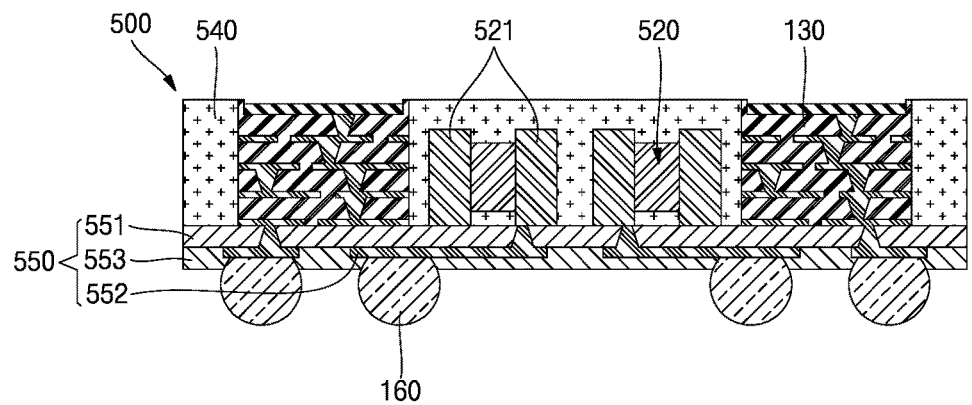
Figure 7D:
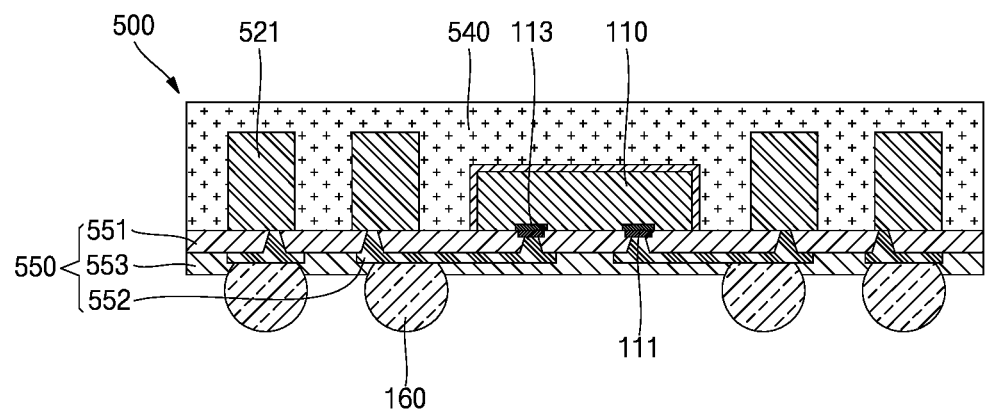

FIGS. 7A to 7D show a transmission plan view of an example semiconductor device, a cross-sectional view taken along the line 7B-7B of FIG. 7A, a cross-sectional view taken along the line 7C-7C of FIG. 7A, and a cross-sectional view taken along the line 7D-7D of FIG. 7A.

In the example shown in FIGS. 7A to 7D, semiconductor device 500 can comprise electronic component 110, passive component 520, antenna elements 130, encapsulant 540, substrate 550, and external interconnects 160.

Electronic component 110, antenna elements 130 and external interconnects 160 can be similar to elements of semiconductor device 100 shown in FIG. 1. Passive component 520 can comprise terminals 521. Substrate 550 can comprise dielectric structures 551 and 553, and conductive structure 552.

Antenna elements 130, encapsulant 540, substrate 550 and external interconnects 160 can comprise or be referred to as semiconductor package 501 or package 501, and can protect electronic component 110 and passive component 520 from external elements or environmental exposure. Semiconductor package 501 can provide electrical coupling between an external element and electronic component 110 and between the external element and passive component 520.

FIGS. 8A to 8F show cross-sectional views of an example method for manufacturing an example semiconductor device 500. FIGS. 9A to 9F show cross-sectional views of an example method for manufacturing example semiconductor device 500 shown in FIGS. 8A to 8F. FIGS. 10A and 10B show plan views of an example method for manufacturing example semiconductor device 500 shown in FIGS. 8A and 8B. Specifically, among cross-sectional views of an example method for manufacturing an example semiconductor device 500, FIGS. 8A to 8F show cross-sectional views taken along the line 7C-7C of FIG. 7A, and FIGS. 9A to 9F show cross-sectional views taken along the line 7D-7D of FIG. 7A. Specifically—cross-sectional views taken along the line 7B-7B of FIG. 7A can be the similar as those shown in FIGS. 2C to 2J.

Figure 8A:
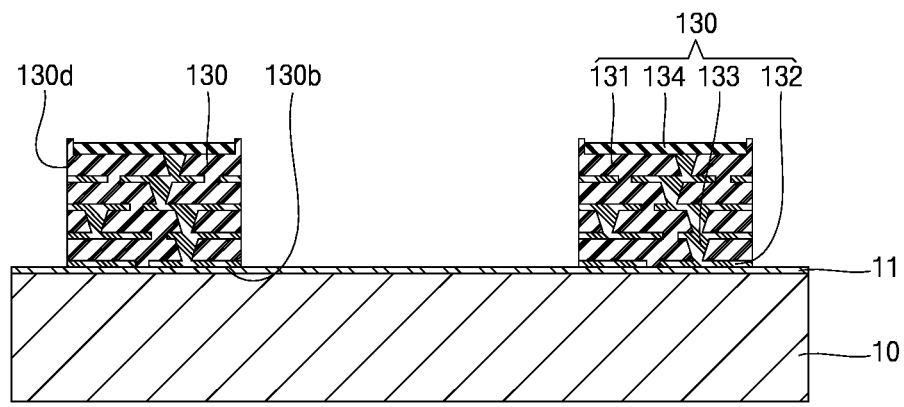
FIGS. 8A to 8F show cross-sectional views of an example method for manufacturing an example semiconductor device.
Figure 9A:
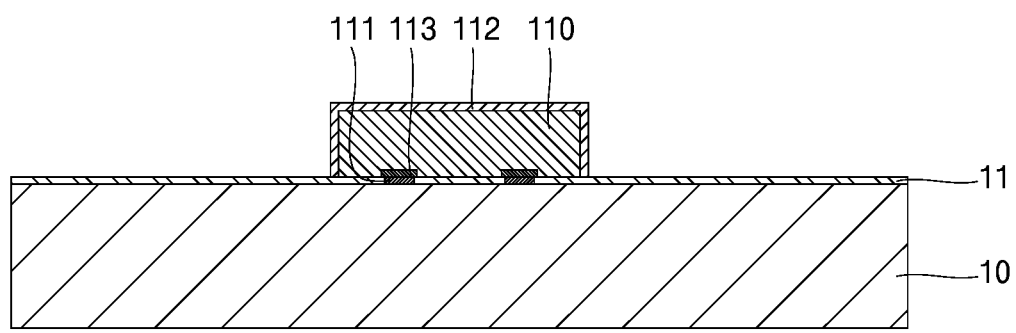
FIGS. 9A to 9F show cross-sectional views of an example method for manufacturing example semiconductor device shown in FIGS. 8A to 8F.
Figure 10A:
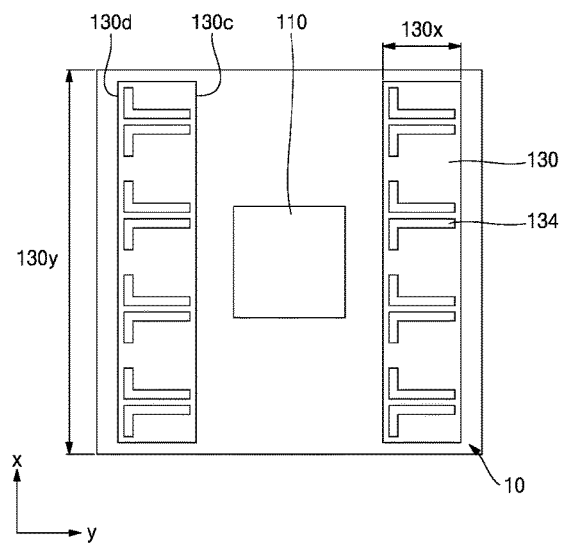
FIGS. 10A and 10B show plan views of an example method for manufacturing example semiconductor device shown in FIGS. 8A and 8B.
Figure 10B:
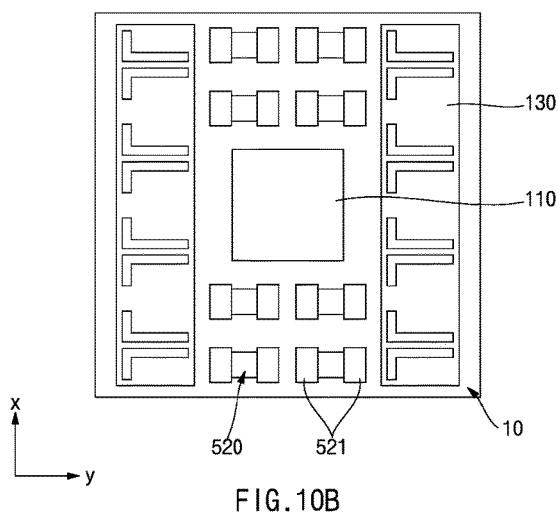

FIGS. 8A, 9A and 10A show semiconductor device 500 at an early stage of manufacture.

In the example shown in FIGS. 8A, 9A and 10A, semiconductor device 500 can be prepared. Semiconductor device 500 shown in FIGS. 8A, 9A and 10A can be similar to semiconductor device 100 manufactured by example method for manufacturing semiconductor device 100 shown in FIGS. 2A to 2C and FIG. 3.

Figure 8B:
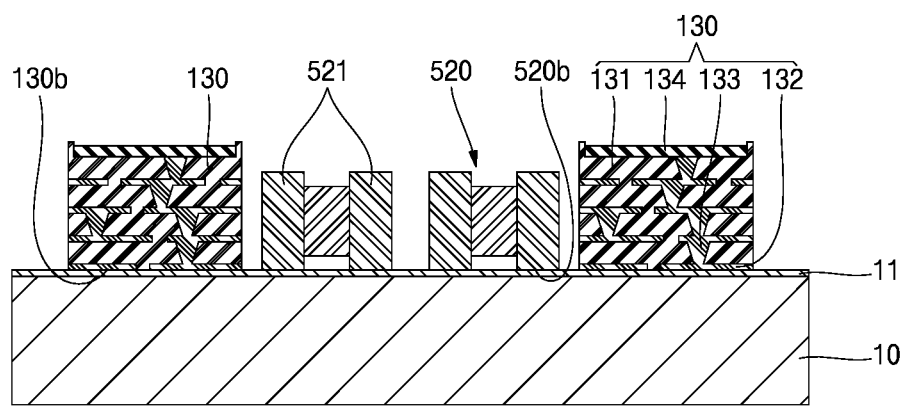
Figure 9B:
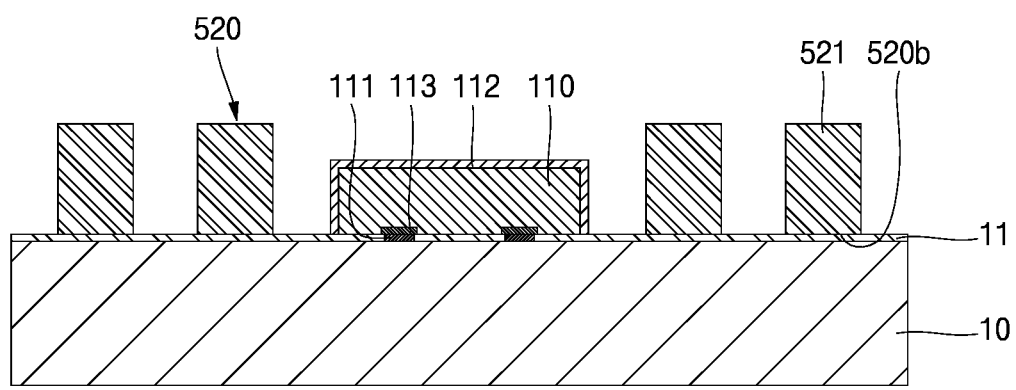

FIGS. 8B, 9B and 10B show semiconductor device 500 at a later stage of manufacture. In the example shown in FIGS. 8B, 9B and 10B, bottom surface 520b of passive component 520 can be adhered to a surface of temporary bond layer 11 of carrier 10. Passive component 520 can be adhered to carrier 10 so as to be positioned at opposite sides of electronic component 110 along first direction x. Passive component 520 can be arranged on and adhered onto temporary bond layer 11 of carrier 10 in a matrix configuration having rows or columns so as to be positioned between antenna elements 130 spaced apart from each other in second direction y. Terminals 521 of passive component 520 can be adhered to temporary bond layer 11.

In some examples, pick-and-place equipment can pick up and place passive component 520 on temporary bond layer 11 of carrier 10 and can be adhered to temporary bond layer 11. Bottom surface of passive component 520 can be adhered to temporary bond layer 11. Passive component 520 can comprise terminals 521 exposed to its bottom surface. Terminals 521 can be adhered to temporary bond layer 11 of carrier 10. Terminals 521 can be input/output terminals of passive component 520.

In some examples, passive component 520 can comprise at least one of a resistor, a capacitor, an inductor, a connector, and equivalents. Passive component 520 can have an overall thickness in the range from approximately 0.01 mm to approximately 2 mm.

Antenna elements 130 can be varied by employing the layouts of antenna elements 130, 230, 330, and 430 shown in FIGS. 2C, 3, 4A, 4B, 5A to 5C, and 6A to 6D. Alternatively, antenna elements 130 can be varied by arbitrarily arranging vertical antennas or horizontal antennas in various manners. Here, passive component 520 can be varied in view of layout so as to be arranged within surface of temporary bond layer 11 of carrier 10 in various manners by employing the layouts of antenna elements 130, 230, 330, and 430.

Figure 8C:
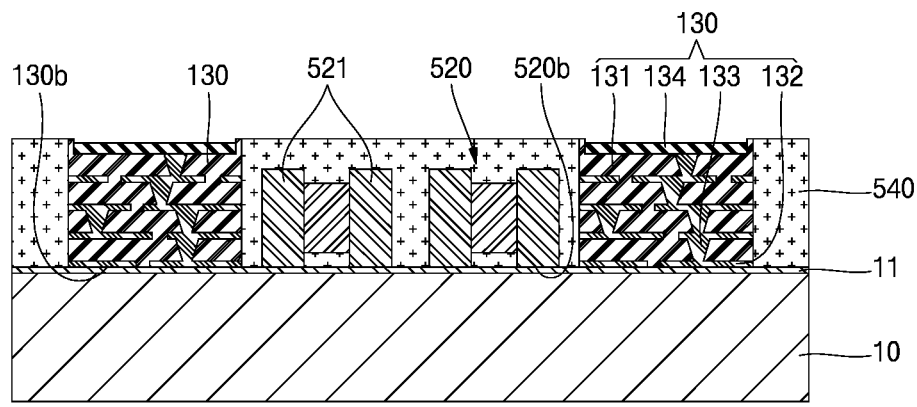
Figure 9C:
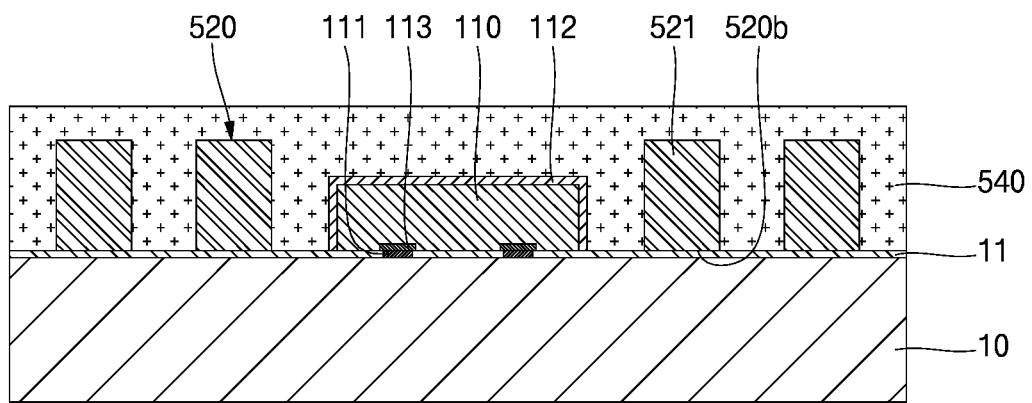

FIGS. 8C and 9C show semiconductor device 500 at a later stage of manufacture. In the example shown in FIGS. 8C and 9C, encapsulant 540 can cover carrier 10, electronic component 110, passive component 520 and antenna elements 130. In some examples, encapsulant 540 can be brought into contact with top surface of temporary bond layer 11 of carrier 10, outer surface of EMI shield 112, top and side surfaces of passive component 520, and side surfaces of antenna elements 130. Here, antenna patterns 134 of antenna elements 130 can be exposed. Encapsulant 540 can be similar to, and can be similarly formed as encapsulant 140.

Figure 8D:
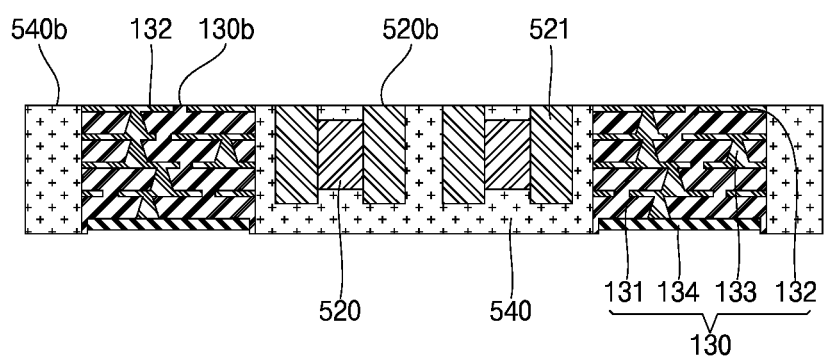
Figure 9D:
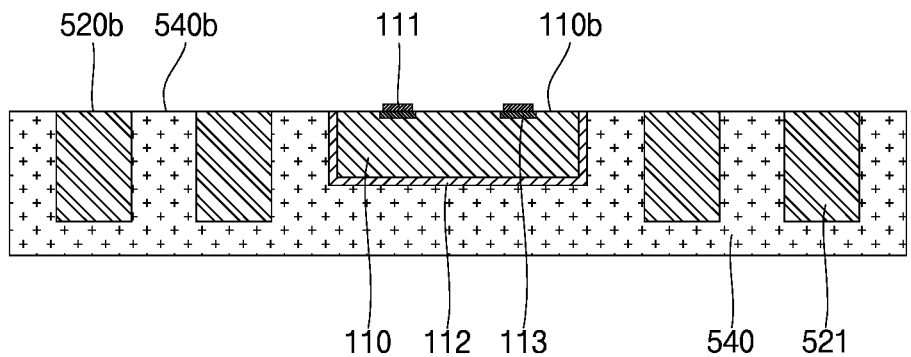

FIGS. 8D and 9D show semiconductor device 500 at a later stage of manufacture. In the example shown in FIGS. 8D and 9D, semiconductor device 500 can be flipped to remove carrier 10 in a state in which carrier 10 is positioned on electronic component 110, passive component 520, antenna elements 130, and encapsulant 540.

Carrier 10 can be removed from top surface 110b of electronic component 110, top surface 520b of passive component 520, top surfaces 130b of antenna elements 130, and top surface 540b of encapsulant 540. Accordingly, top surface 110b of electronic component 110, top surface 520b of passive component 520, top surfaces 130b of antenna elements 130, and top surface 540b of encapsulant 540, can be exposed. Internal interconnects 111 of electronic component 110, terminals 521 of passive component 520, and conductive terminals 132 of antenna elements 130, can also be exposed. Removing of carrier 10 can be similar to removing of carrier 10 shown in FIG. 2E.

Figure 8E:
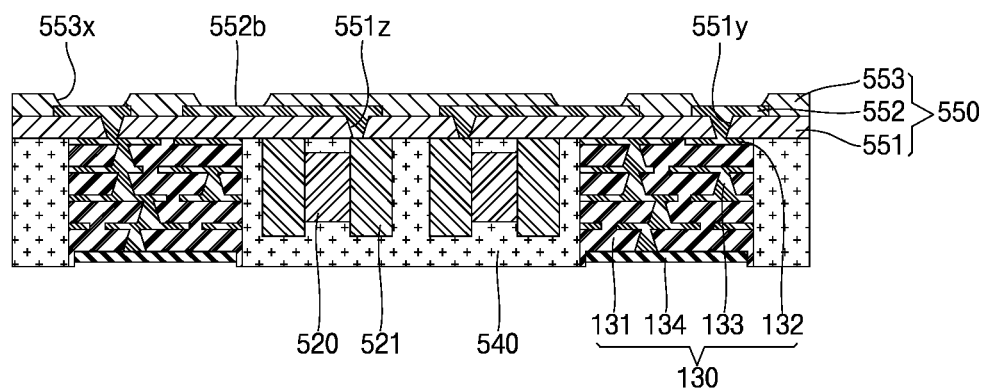
Figure 9E:
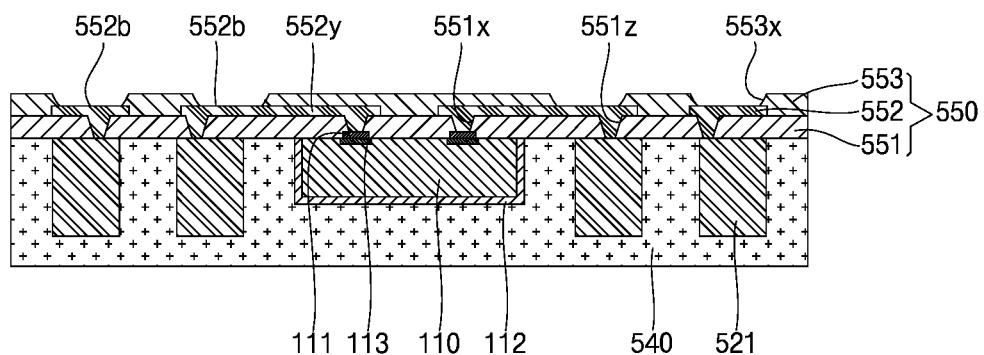

FIGS. 8E and 9E show semiconductor device 500 at a later stage of manufacture. In the example shown in FIGS. 8E and 9E, substrate 550 can be formed on top surface 110b of electronic component 110, top surface 520b of passive component 520, top surfaces 130b of antenna elements 130, and top surface 540b of encapsulant 540. In some examples, substrate 550 can be similar to substrate 150, or can comprise or be referred to as a substrate. Substrate 550 can comprise dielectric structure 551, conductive structure 552 and dielectric structure 553, and are sequentially formed in that order.

Dielectric structure 551 can be first formed on substrate 550 to cover top surface 110b of electronic component 110, top surface 520b of passive component 520, top surfaces 130b of antenna elements 130, and top surface 540b of encapsulant 540 to a uniform thickness. Apertures 551x, 551y and 551z exposing internal interconnects 111 of electronic component 110, conductive terminals 132 of antenna elements 130 and terminals 521 of passive component 520, respectively, can be formed in dielectric structure 551. Dielectric structure 551 can expose top surfaces of internal interconnects 111 of electronic component 110 through apertures 551x, top surfaces of conductive terminals 132 of antenna elements 130 through apertures 551y, and top surfaces of terminals 521 of passive component 520 through apertures 551z, respectively. Dielectric structure 551 can be similar to, and can be similarly formed as dielectric structure 151.

Conductive structure 552 can cover internal interconnects 111 of electronic component 110, conductive terminals 132 of antenna elements 130 and terminals 521 of passive component 520, and are exposed through top surface of dielectric structure 551 and apertures 551x, 551y and 551z.

Conductive structure 552 can be formed to have multiple patterns, and are brought into contact with interconnects 111 of electronic component 110, conductive terminals 132 of antenna elements 130 and terminals 521 of passive component 520, and are exposed through apertures 551x, 551y and 551z, respectively, and can be electrically connected. Conductive structure 552 can comprise traces 552x electrically connecting internal interconnects 111 of electronic component 110 and terminals 521 of passive component 520 with each other. Trace 552x can extend from a point over electronic component 110 to a point over passive component 520 to electrically connect internal interconnects 111 of electronic component 110 and conductive terminals 132 of antenna elements 130 with each other, like passive component 520. Trace 552x can also electrically connect internal interconnects 111 of electronic component 110 with conductive terminals 132 of antenna elements 130, like conductive structure 152 shown in FIG. 2G. Conductive structure 552 can be similar to, and can be similarly formed as conductive structure 152.

Dielectric structure 553 can cover dielectric structure 551 and conductive structure 552 to a uniform thickness. Aperture 553x exposing top surface 552b of conductive structure 552 can be formed in dielectric structure 553. Dielectric structure 553 can also expose top surfaces of traces 552y through apertures 553x. Dielectric structure 553 can be similar to, and can be similarly formed as, dielectric structure 151.

Although only two dielectric structures 551 and 553 and one conductive structure 552 are shown in substrate 550, this is not a limitation of the present disclosure. In some examples, the number of structures that make up substrate 550 can be smaller or greater than that shown in the present disclosure.

Figure 8F:
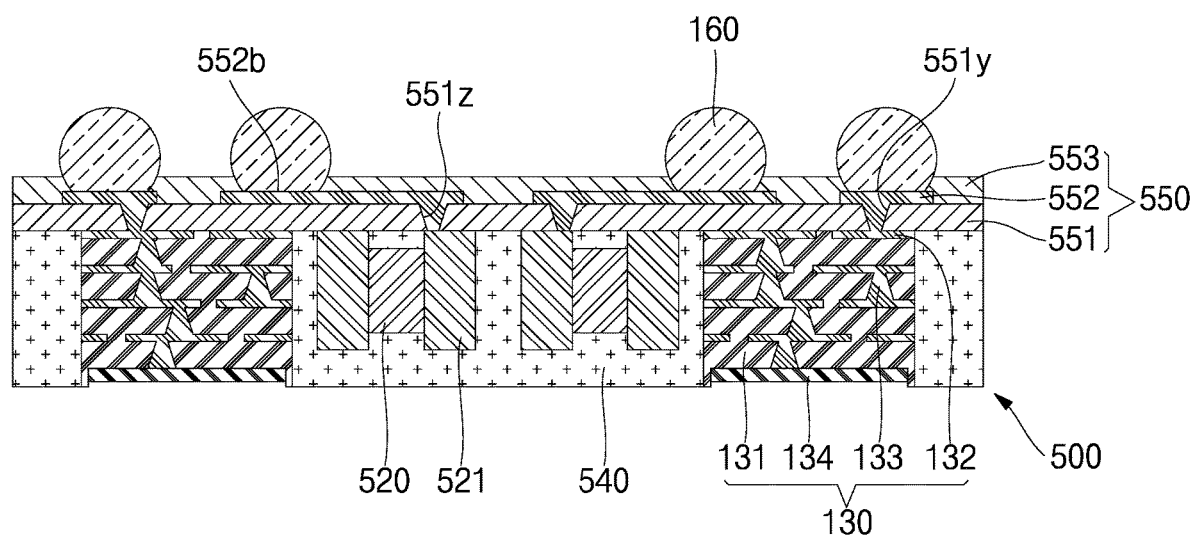
Figure 9F:
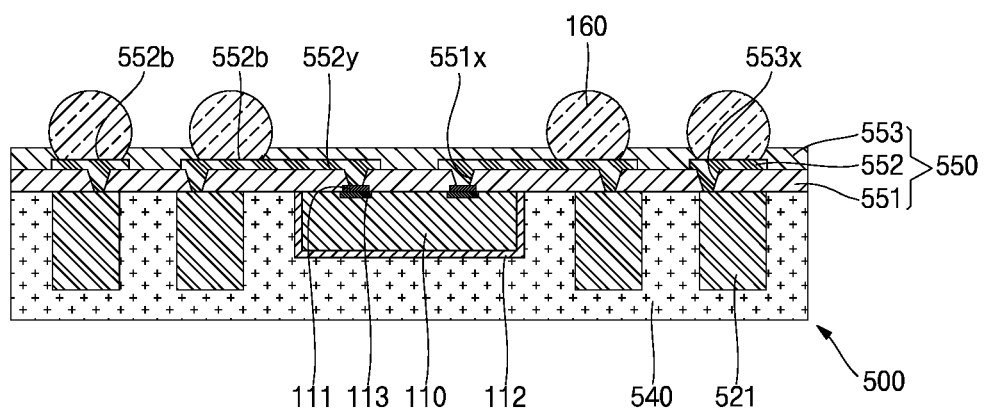

FIGS. 8F and 9F show semiconductor device 500 at a later stage of manufacture. In the example shown in FIGS. 8F and 9F, external interconnects 160 can be formed on top surface 552b of conductive structure 552.

External interconnects 160 can be electrically connected to top surface 552b of conductive structure 552. External interconnects 160 can be electrically connected to electronic component 110, passive component 520 or antenna elements 130 through substrate 150. External interconnects 160 can be electrically connected to both of electronic component 110 and antenna elements 130 through conductors 152x, or can be electrically connected to both of electronic component 110 and passive component 520. External interconnects 160 can be similar to, and can be similarly formed as external interconnects 160 of semiconductor device 100.

Figure 11:
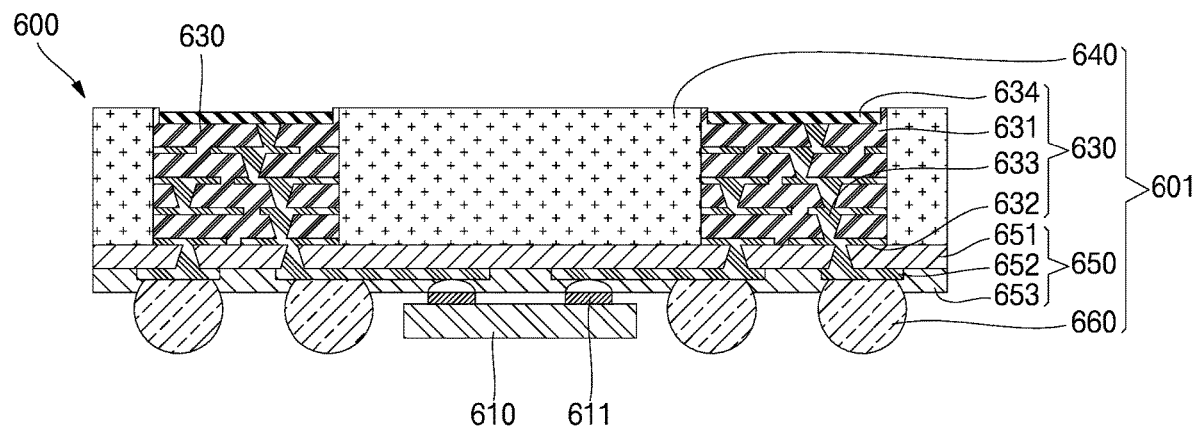
FIG. 11 shows a cross-sectional view of an example semiconductor device.

FIG. 11 shows a cross-sectional view of an example semiconductor device 600. In the example shown in FIG. 11, semiconductor device 600 can comprise electronic component 610, antenna elements 630, encapsulant 640, substrate 650, and external interconnects 660.

Electronic component 610 can comprise internal interconnects 611. Antenna elements 630 can comprise dielectric structure 631, conductive structures 632 and 633, and antenna patterns 634. Substrate 650 can comprise dielectric structures 651 and 653, and conductive structure 652.

Antenna elements 630, encapsulant 640, substrate 650 and external interconnects 660 can comprise or be referred to as semiconductor package 601 or package 601, and can protect electronic component 610 from external elements or environmental exposure.

FIGS. 12A to 12F show cross-sectional views of an example method for manufacturing an example semiconductor device 600. FIG. 13 shows a plan view of an example method for manufacturing example semiconductor device 600 shown in FIG. 12A.

Figure 12A:
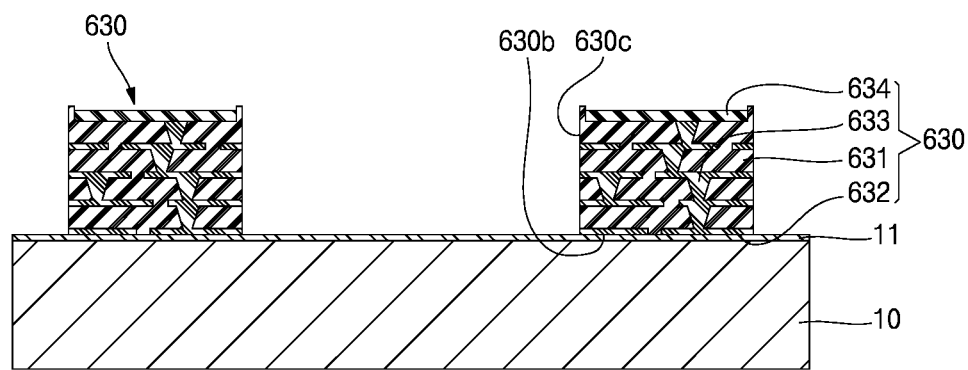
FIGS. 12A to 12F show cross-sectional views of an example method for manufacturing an example semiconductor device.
Figure 13:
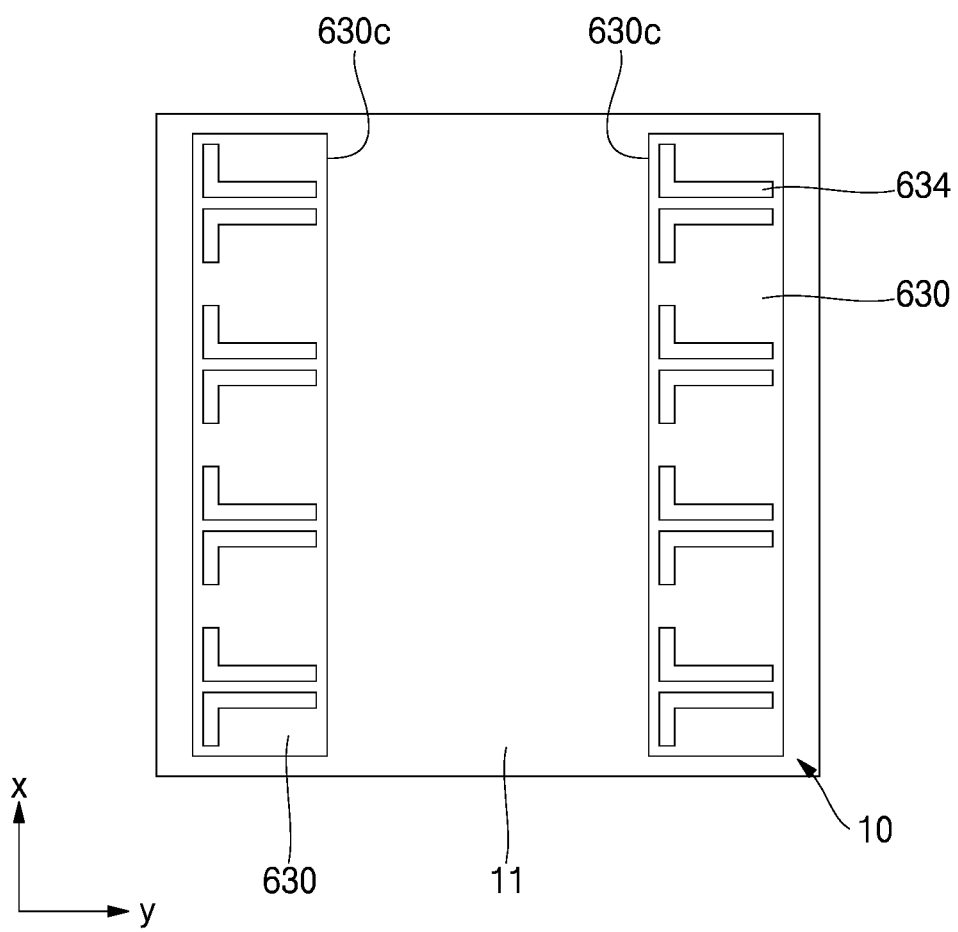
FIG. 13 shows a plan view of an example method for manufacturing example semiconductor device shown in FIG. 12A.

FIGS. 12A and 13 show semiconductor device 600 at an early stage of manufacture. In the example shown in FIGS. 12A and 13, bottom surfaces 630b of antenna elements 630 can be adhered to temporary bond layer 11 provided on carrier 10.

In some examples, pick-and-place equipment can pick up and place antenna elements 630 on a surface of temporary bond layer 11 of carrier 10 and can be adhered to temporary bond layer 11. In some examples, two antenna elements 630 can be adhered onto carrier 10 so as to be positioned at opposite sides along second direction y. Two antenna elements 630 can be arranged such that inner surfaces 630c of .two antenna elements 630 face each other and can be spaced apart from each other. Each of antenna elements 630 can lengthwise extend along first direction x. Antenna elements 630 can be similar to, and can be similarly formed as antenna elements 130. Antenna elements 630 can be varied by employing the layouts of antenna elements 230, 330 and 430 shown in FIGS. 3, 4A, 4B, 5A to 5C and 6A to 6D. Alternatively, antenna elements 630 can be varied by arbitrarily arranging vertical antennas or horizontal antennas in various manners.

Figure 12B:
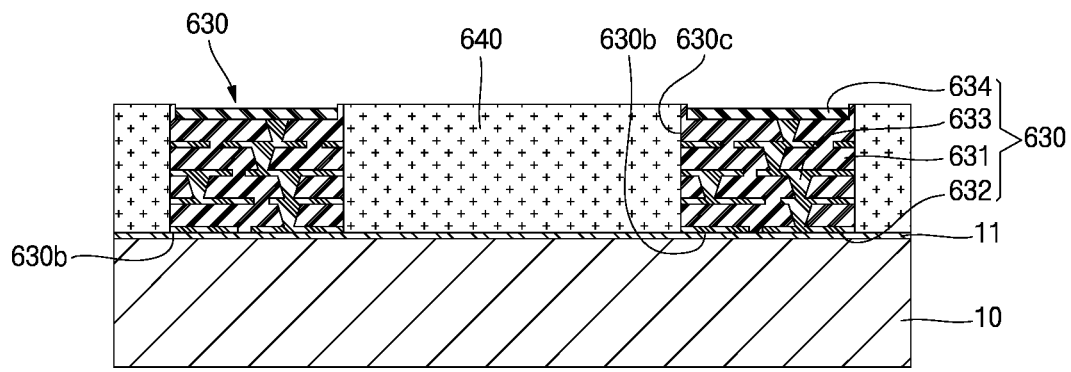

FIG. 12B shows semiconductor device 600 at a later stage of manufacture. In the example shown in FIG. 12, encapsulant 640 can cover carrier 10 and antenna elements 630. In some examples, encapsulant 640 can contact top surface of temporary bond layer 11 of carrier 10 and side surfaces of antenna elements 630. Here, antenna patterns 634 of antenna elements 630 can be exposed. Encapsulant 640 can be similar to, and can be similarly formed as encapsulant 140.

Figure 12C:
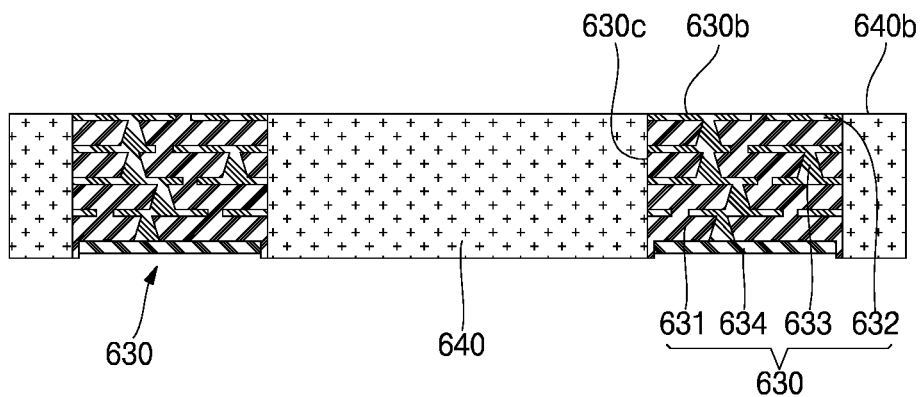

FIG. 12C shows semiconductor device 600 at a later stage of manufacture. In the example shown in FIG. 12C, semiconductor device 600 can be flipped to remove carrier 10 in a state in which carrier 10 is positioned on antenna elements 630 and encapsulant 640.

Carrier 10 can be removed from top surfaces 630b of antenna elements 630 and top surface 640b of encapsulant 640. Accordingly, top surfaces 630b of antenna elements 630 and top surface 640b of encapsulant 640 can be exposed. Conductive patterns 632 of antenna elements 630 can also be exposed. Removing of carrier 10 can be similar to removing of carrier 10 shown in FIG. 2E.

Figure 12D:
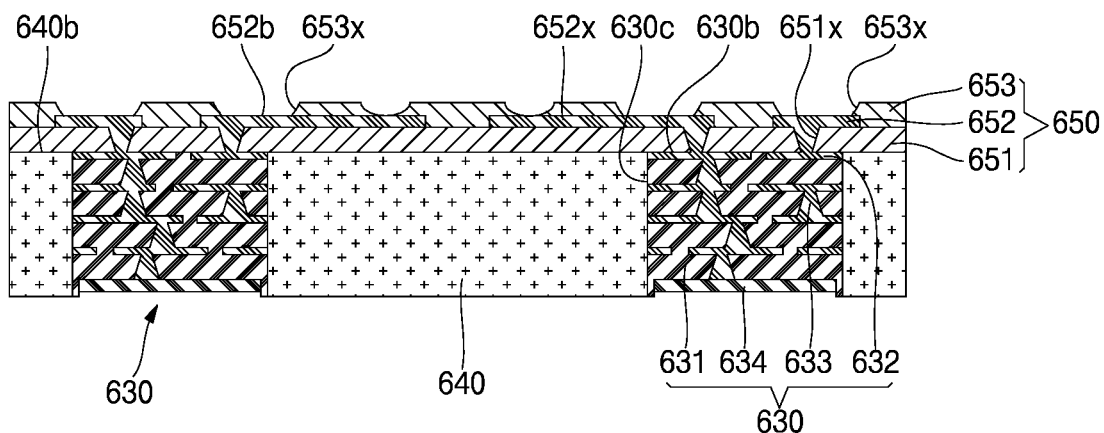

FIG. 12D shows semiconductor device 600 at a later stage of manufacture. In the example shown in FIG. 12D, substrate 650 can be formed on top surfaces 630b of antenna elements 630 and top surface 640b of encapsulant 640. In some examples, substrate 650 can be similar to substrate 150, or can comprise or be referred to as a substrate. Substrate 650 can comprise dielectric structure 651, conductive structure 652 and dielectric structure 653, and are sequentially formed in that order.

Dielectric structure 651 can cover top surfaces 630b of antenna elements 630 and top surface 640b of encapsulant 640 to a uniform thickness. Apertures 651x exposing conductive patterns 632 of antenna elements 630 can be formed in dielectric structure 651. Dielectric structure 651 can expose top surfaces of conductive patterns 632 of antenna elements 630 through apertures 651x. Dielectric structure 651 can be similar to, and can be similarly formed as dielectric structure 151.

Conductive structure 652 can cover top surface of dielectric structure 651 and conductive patterns 632 of antenna elements 630 exposed through apertures 651x. Conductive structure 652 can have multiple patterns, and are brought into contact with conductive patterns 632 of antenna elements 630, exposed through apertures 651x, respectively, and can be electrically connected. Conductive structure 652 can be electrically connected to conductive patterns 632 of antenna elements 630 and can comprise traces 652x extending along top surface 640b of encapsulant 640. Conductive structure 652 can be similar to, and can be similarly formed as conductive structure 152.

Dielectric structure 653 can cover dielectric structure 651 and conductive structure 652 to a uniform thickness. Apertures 653x exposing top surface 652b of conductive structure 652 can be formed in dielectric structure 653. Dielectric structure 653 can also expose top surfaces of traces 652x through apertures 653x. Dielectric structure 653 can be similar to, and can be similarly formed as dielectric structure 651.

Although only two dielectric structures 651 and 653 and one conductive structure 652 are shown in substrate 650, this is not a limitation of the present disclosure. In some examples, the number of structures that make up substrate 650 can be smaller or greater than that shown in the present disclosure.

Figure 12E:
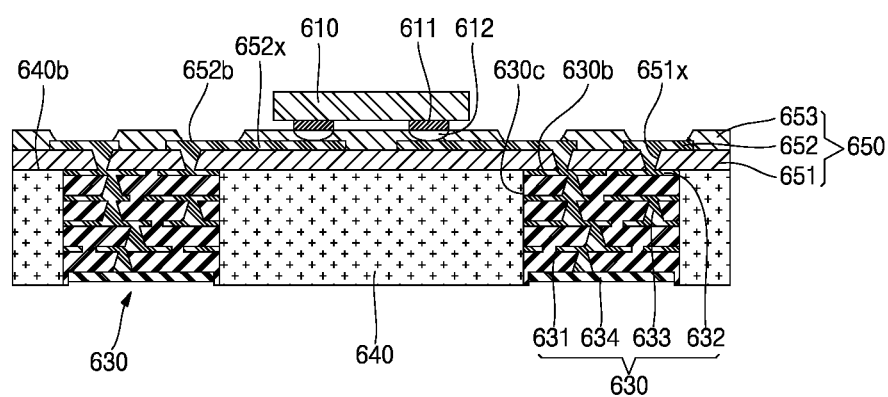

FIG. 12E shows semiconductor device 600 at a later stage of manufacture. In the example shown in FIG. 12E, internal interconnects 611 of electronic component 610 can be electrically connected to top surface 652b of conductive structure 652. Electronic component 610 can be positioned at the center of substrate 650.

In some examples, pick-and-place equipment can pick up and place electronic components 610 on traces 652x of conductive structure 652 of substrate 650. Subsequently, electronic component 610 can be electrically connected to conductive structure 652 of substrate 650 using a mass reflow process, a thermal compression process or a film assist bonding process. Electronic component 610 can be electrically connected to antenna elements 630 through conductive structure 652 of substrate 650.

In some examples, electronic component 610 can comprise an active region and a non-active region. In some examples, active region can be formed to face substrate 650. In some examples, active region can comprise internal interconnects 611. In some examples, internal interconnects 611 can comprise or be referred to as die pads, bond pads, aluminum pads, conductive pillars or conductive posts.

Internal interconnects 611 can be connected to conductive structure 652 of substrate 650 using low melting point material 612. In some examples, low melting point material 612 can comprise one selected from the group consisting of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, and equivalents. Internal interconnects 611 of electronic component 610 and conductive structure 652 of substrate 650 can be electrically connected to each other by such low melting point material 612. Electronic component 610 can have an overall thickness in the range from approximately 0.1 mm to approximately 1 mm.

Figure 12F:
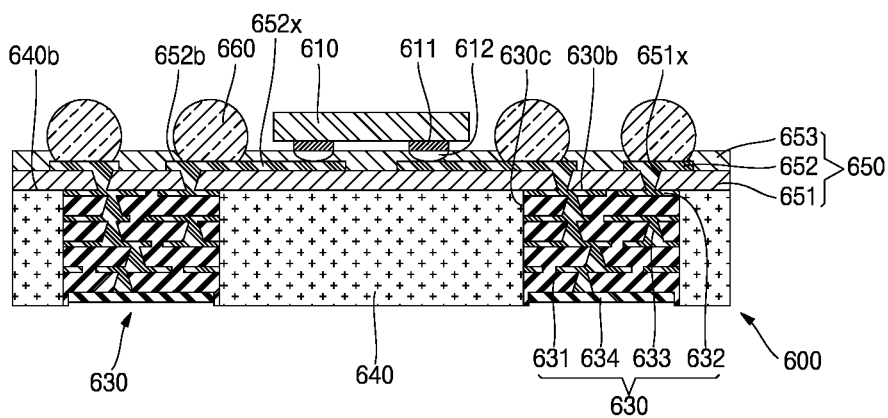

FIG. 12F shows semiconductor device 600 at a later stage of manufacture. In the example shown in FIG. 12F, external interconnects 660 are formed on top surface 652b of conductive structure 652. External interconnects 660 can be electrically connected to top surface 652b of conductive structure 652.

External interconnects 660 can be arranged at exterior sides of electronic component 610 to be spaced apart from each other in a matrix configuration having rows or columns. External interconnects 660 can be electrically connected to electronic component 610 or antenna elements 630 through substrate 650. External interconnects 660 can be electrically connected to both of electronic component 610 and antenna elements 630 through traces 652x. External interconnects 660 can be similar to, and can be similarly formed as external interconnects 160.

Figure 14:
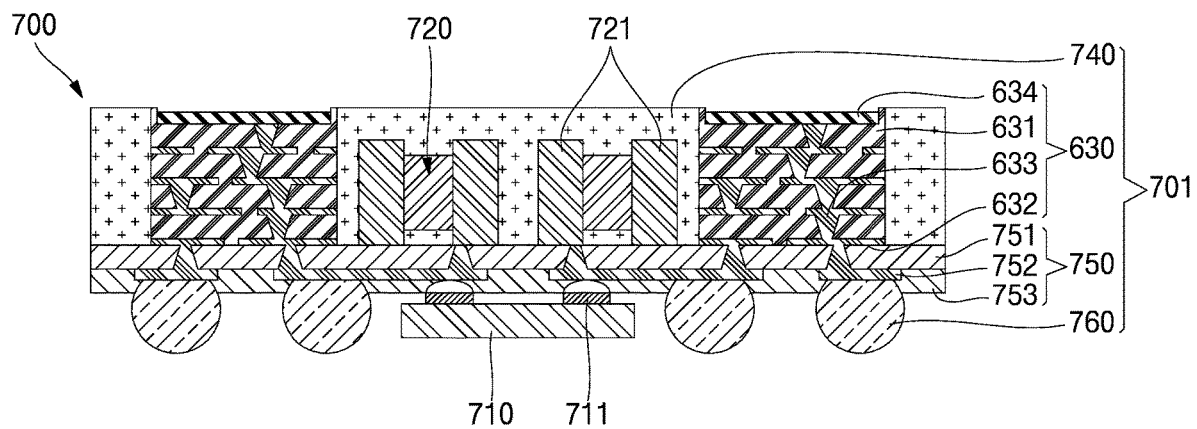
FIG. 14 shows a cross-sectional view of an example semiconductor device.

FIG. 14 shows a cross-sectional view of an example semiconductor device 700. In the example shown in FIG. 14, semiconductor device 700 can comprise electronic component 710, passive component 720, antenna elements 630, encapsulant 740, substrate 750, and external interconnects 760.

Electronic component 710 can comprise internal interconnects 711. Passive component 720 can comprise terminals 721. Antenna elements 630 can comprise dielectric structure 631, conductive structures 632 and 133, and antenna patterns 634. Substrate 750 can comprise dielectric structures 751 and 653 and conductive structure 752.

Antenna elements 630, encapsulant 740, substrate 750 and external interconnects 760 can comprise or be referred to as semiconductor package 701 or package 701, and can protect electronic component 710 from external elements or environmental exposure. Semiconductor package 701 can provide electrical coupling between an external element and electronic component 710.

FIGS. 15A to 15G show cross-sectional views of an example method for manufacturing an example semiconductor device 700. FIGS. 16A and 16B show plan views of an example method for manufacturing example semiconductor device 700 shown in FIGS. 15A and 15B.

Figure 15A:
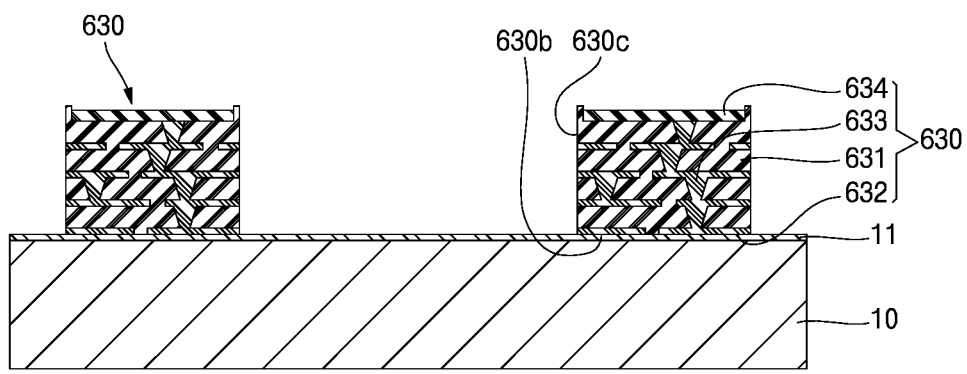
FIGS. 15A to 15G show cross-sectional views of an example method for manufacturing an example semiconductor device.
Figure 16A:
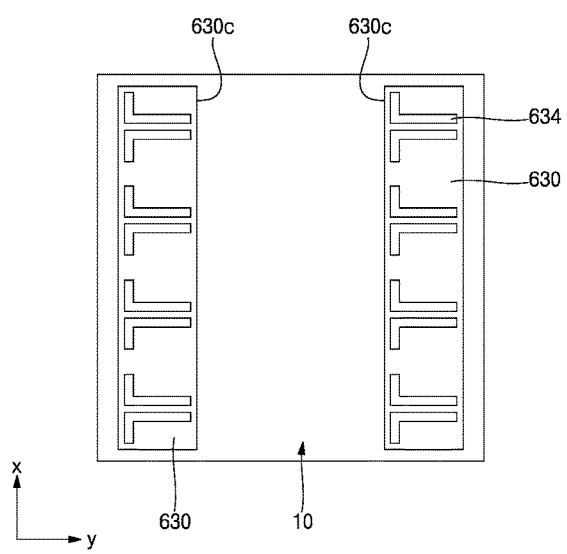
FIGS. 16A and 16B show plan views of an example method for manufacturing example semiconductor device shown in FIGS. 15A and 15B.
Figure 16B:
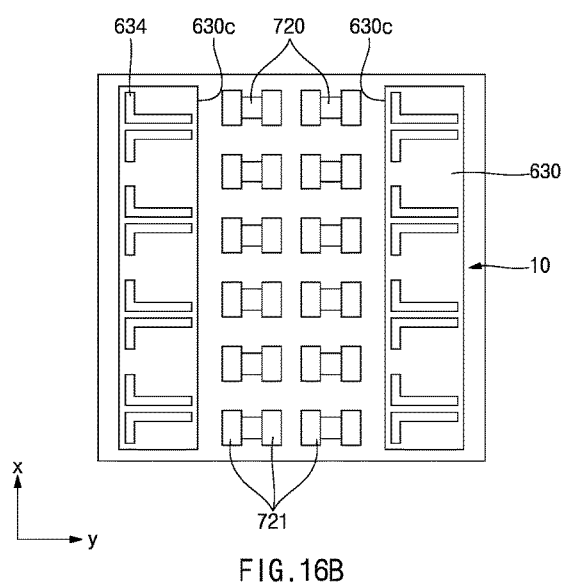

FIGS. 15A and 16A show semiconductor device 700 at an early stage of manufacture. In the example shown in FIGS. 15A and 16A, semiconductor device 700 can be prepared. Semiconductor device 700 shown in FIGS. 15A and 16A can be the similar with semiconductor device 600 manufactured by example method shown in FIGS. 12A and 13.

Figure 15B:
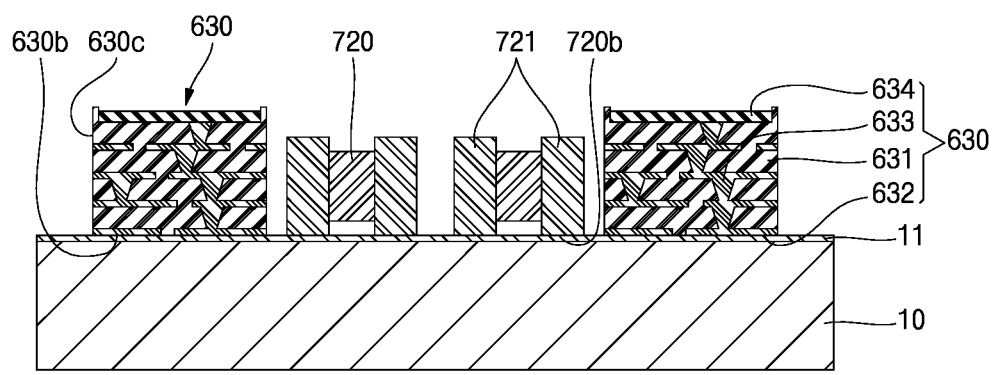

FIG. 15B shows semiconductor device 700 at a later stage of manufacture. In the example shown in FIG. 15B, bottom surface 720b of passive component 720 can be adhered to a surface of temporary bond layer 11 of carrier 10. Passive component 720 can be positioned between interior side surfaces 630c of two spaced-apart antenna elements 630. Passive component 720 can be arranged on temporary bond layer 11 of carrier 10 to be spaced apart from each other in a matrix configuration having rows or columns so as to be positioned between two antenna elements 630 spaced apart from each other in second direction y and can be adhered to temporary bond layer 11 of carrier 10. Terminals 721 of passive component 720 can also be adhered to temporary bond layer 11. Passive component 720 can be similar to, and can be similarly formed as passive component 520.

Figure 15C:
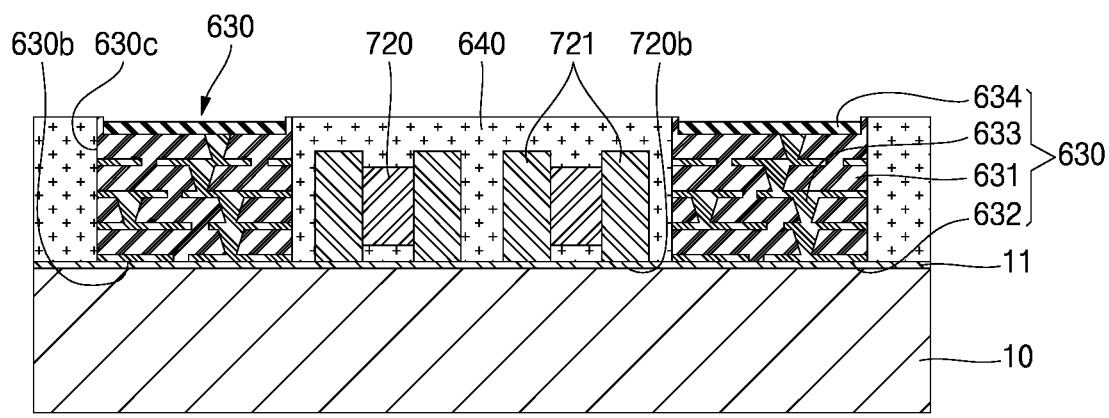

FIG. 15C shows semiconductor device 700 at a later stage of manufacture. In the example shown in FIG. 15C, encapsulant 740 can cover carrier 10, passive component 720, and antenna elements 630. In some examples, encapsulant 740 can be brought into contact with top surface of temporary bond layer 11 of carrier 10, top and side surfaces of passive component 720 and side surfaces of antenna elements 630. Here, antenna patterns 634 of antenna elements 630 can be exposed. Encapsulant 740 can be similar to, and can be similarly formed as encapsulant 140.

Figure 15D:
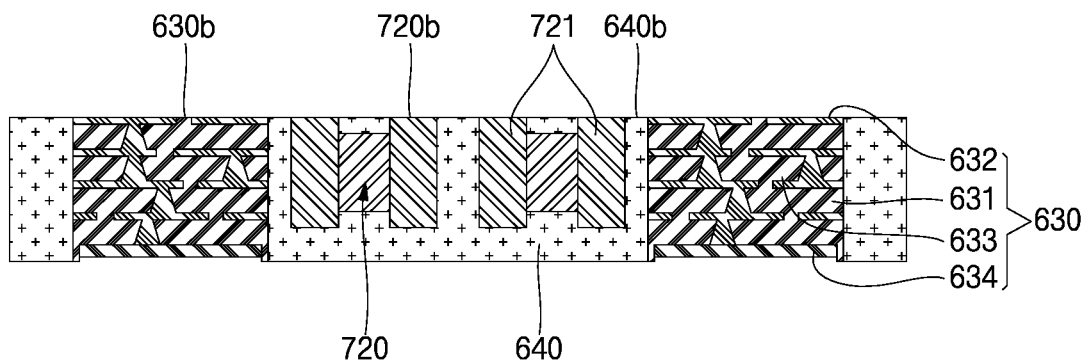

FIG. 15D shows semiconductor device 700 at a later stage of manufacture. In the example shown in FIG. 15D, semiconductor device 700 can be flipped to remove carrier 10 in a state in which carrier 10 is positioned on antenna elements 630 and encapsulant 740.

Carrier 10 can be removed from top surfaces 630b of antenna elements 630, top surface 720b of passive component 720 and top surface 740b of encapsulant 740. Accordingly, top surfaces 630b of antenna elements 630, top surface 720b of passive component 720 and top surface 740b of encapsulant 740 can also be exposed. Terminals 721 of passive component 720 and conductive patterns 632 of antenna elements 630 can also be exposed. Removing of carrier 10 can be similar to removing of carrier 10 shown in FIG. 2E.

Figure 15E:
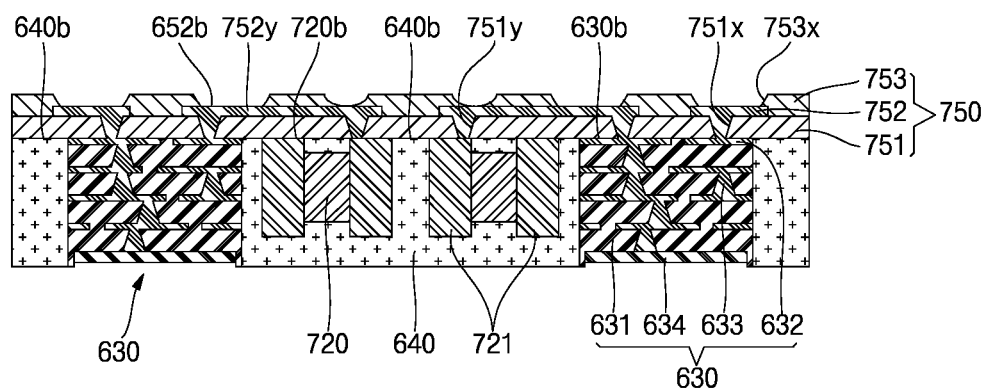

FIG. 15E shows semiconductor device 700 at a later stage of manufacture. In the example shown in FIG. 15E, substrate 750 can be formed on top surfaces 630b of antenna elements 630 and top surface 740b of encapsulant 740. In some examples, substrate 650 can be similar to substrate 150, or can comprise or be referred to as a substrate. Substrate 750 can comprise dielectric structure 751, conductive structure 752 and dielectric structure 753, and are sequentially formed in that order.

Dielectric structure 751 can cover top surfaces 630b of antenna elements 630, top surface 720b of passive component 720 and top surface 740b of encapsulant 740 to a uniform thickness. Apertures 751x and 751y exposing conductive patterns 632 of antenna elements 630 and terminals 721 of passive component 720 can be formed in dielectric structure 751. Dielectric structure 751 can also expose conductive patterns 632 of antenna elements 630 and terminals 721 of passive component 720 through apertures 751x and 751y. Dielectric structure 751 can be similar to, and can be similarly formed as dielectric structure 151.

Conductive structure 752 can cover top surface of dielectric structure 751, conductive patterns 632 of antenna elements 630 and terminals 721 of passive component 720, exposed through apertures 751x and 751y. Conductive structure 752 can have multiple patterns, and are brought into contact with conductive patterns 632 of antenna elements 630 and terminals 721 of passive component 720, exposed through apertures 751x and 751y, respectively, and can be electrically connected. Conductive structure 752 can be electrically connected to terminals 721 of passive component 720 and can comprise traces 752y extending along top surface 740b of encapsulant 740. Traces 752y can be electrically connected to conductive patterns 632 of antenna elements 630, like in conductive structure 652 shown in FIG. 12D, and can extend along top surface 740b of encapsulant 740. Conductive structure 752 can be similar to, and can be similarly formed as conductive structure 152.

Dielectric structure 753 can cover dielectric structure 751 and conductive structure 752 to a uniform thickness. Apertures 753x exposing top surface 752b of conductive structure 752 can be formed in dielectric structure 753. Dielectric structure 753 can also expose top surfaces of traces 752y through apertures 753x. dielectric structure 753 can be similar to, and can be similarly formed as, dielectric structure 751.

Although only two dielectric structures 751 and 753 and one conductive structure 752 are shown in substrate 750, this is not a limitation of the present disclosure. In some examples, the number of structures that make up substrate 750 can be smaller or greater than that shown in the present disclosure.

Figure 15F:
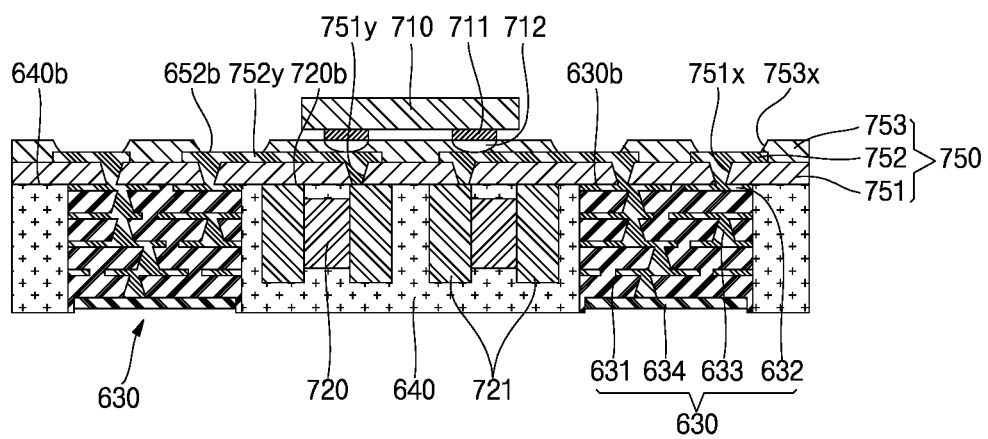

FIG. 15F shows semiconductor device 700 at a later stage of manufacture. In the example shown in FIG. 15F, internal interconnects 711 of electronic component 710 can be electrically connected to top surface 752b of conductive structure 752. Electronic component 710 can be positioned at the center of substrate 750. Electronic component 710 can be positioned on traces 752y to be electrically connected to conductive structure 752. Electronic component 710 can be electrically connected to passive component 720 or antenna elements 730 through substrate 750. Electronic component 710 can be similar to, and can be similarly formed as electronic component 610.

Figure 15G:
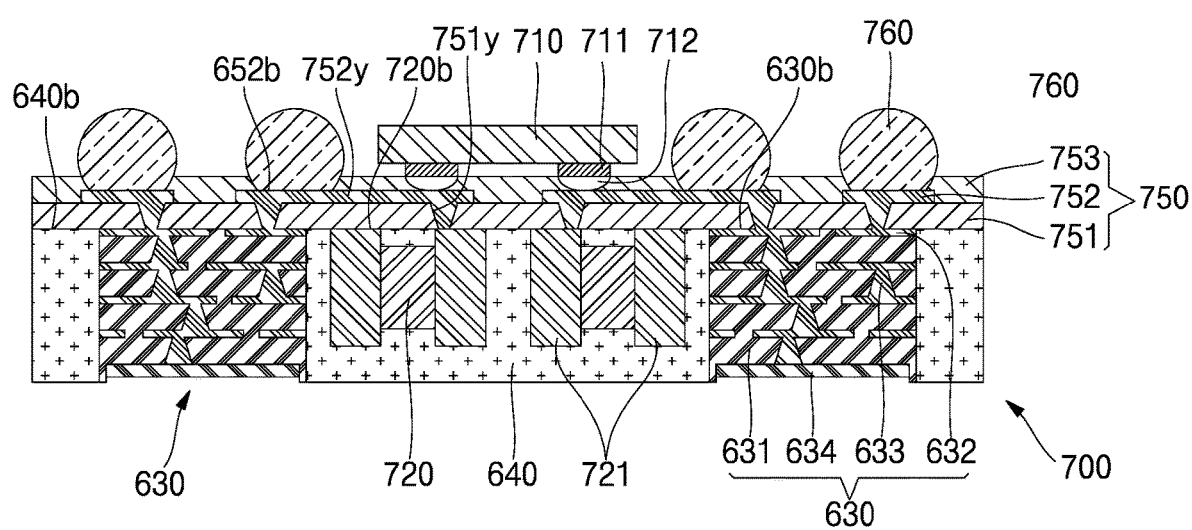

FIG. 15G shows semiconductor device 700 at a later stage of manufacture. In the example shown in FIG. 15G, external interconnects 760 can be formed on top surface 752b of conductive structure 752. External interconnects 760 can be electrically connected to top surface 752b of conductive structure 752.

External interconnects 760 can be formed at exterior sides of electronic component 710 to be spaced apart from each other in a matrix configuration having rows or columns. External interconnects 760 can be electrically connected to electronic component 710, passive component 720 or antenna elements 730 through substrate 750. External interconnects 760 can be electrically connected to both of electronic component 710 and passive component 720 through traces 752y, or to both of electronic component 710 and antenna elements 630. External interconnects 760 can be similar to, and can be similarly formed as external interconnects 160.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device comprising:
   a substrate comprising:
      a substrate top side;
      a substrate bottom side;
      a substrate dielectric structure between the substrate top side and the substrate bottom side; and
      a substrate conductive structure traversing the substrate dielectric structure and comprising:
         a first substrate terminal; and
         a second substrate terminal at the substrate top side;
   an electronic component coupled to the substrate and comprising:
      a component terminal coupled to the first substrate terminal; and
   a first antenna element coupled to the substrate and comprising:
      a first element dielectric structure;
      a first antenna pattern coupled to the first element dielectric structure;
      a first element terminal exposed from the first element dielectric structure;
      a first element head side adjacent first antenna pattern;
      a first element base side opposite the first element head side; and
      a first element sidewall between the first element head side and the first element base side;
   wherein:
      a bottom side of the first element terminal is exposed from the first element dielectric structure at the first element base side and a lateral side of the first element terminal is exposed from the first element dielectric structure at the first element sidewall, and at least one of the bottom side of the first element terminal or the lateral side of the first element terminal is coupled to the second substrate terminal;
      the first antenna pattern is coupled to the substrate through the first element terminal;
      the first antenna element is coupled to the substrate outside a footprint of the electronic component; and
      the substrate conductive structure couples the first antenna element to the electronic component.

2. The semiconductor device of claim 1, wherein:
   the first antenna element comprises:
      a first antenna path traversing the first element dielectric structure and coupled to the first antenna pattern and the first element terminal.

3. The semiconductor device of claim 1, wherein:
   the first antenna pattern is oriented for communication along a direction substantially orthogonal to the first element head side.

4. The semiconductor device of claim 1, wherein:
   the first antenna element comprises:
      the first element head side facing a vertical direction, with the first antenna pattern oriented for communication along the vertical direction;
      the first element base side coupled to the substrate; and
      the bottom side of the first element terminal is coupled to the second substrate terminal.

5. The semiconductor device of claim 1, wherein:
   the first antenna element comprises:

the first element head side facing a first horizontal direction, with the first antenna pattern oriented for communication along the first horizontal direction;
the first element sidewall coupled to the substrate; and
the lateral side of the first element terminal is coupled to the second substrate terminal.

6. The semiconductor device of claim 1, comprising:
a second antenna element coupled to the substrate;
wherein:
the substrate comprises, around a footprint of the electronic component:
a substrate leftward portion, a substrate rightward portion,
a substrate upward portion, and a substrate downward portion;
the first antenna element is coupled to the substrate top side at the substrate leftward portion; and
the second antenna element is coupled to the substrate top side at the substrate rightward portion.

7. The semiconductor device of claim 6, comprising:
an encapsulant on the substrate top side;
wherein:
the second antenna element comprises a second antenna pattern adjacent a second element head side;
the second antenna element comprises a second element sidewall;
the encapsulant covers the first element sidewall and the second element sidewall; and
the encapsulant exposes the first element head side and the second element head side.

8. The semiconductor device of claim 7, wherein:
the electronic component comprises:
a component first side coupled to the substrate top side;
a component second side opposite the component first side;
a component sidewall between the component first side and the component second side; and
a shield structure covering contacting the component second side and the component sidewall; and
the encapsulant covers the shield structure adjacent the component sidewall.

9. The semiconductor device of claim 6, wherein:
the first antenna element comprises:
the first element head side facing a vertical direction, with the first antenna pattern oriented for communication along the vertical direction;
the first element base side coupled to the substrate; and
the bottom side of the first element terminal is coupled to the second substrate terminal, and
the second antenna element comprises:
a second element head side facing the vertical direction, with a second antenna pattern oriented for communication along the vertical direction; and
a second element base side coupled to the substrate.

10. The semiconductor device of claim 7, wherein:
the first antenna pattern is oriented for communication topward along a vertical direction; and
the second antenna pattern is oriented for communication bottomward along the vertical direction.

11. The semiconductor device of claim 6, wherein:
the first antenna element comprises:
the first element head side facing a rightward direction, with the first antenna pattern oriented for communication along the rightward direction;
the first element sidewall coupled to the substrate; and
the lateral side of the first element terminal is coupled to the second substrate terminal and the second antenna element comprises:
a second element head side facing a leftward direction opposite the rightward direction, with a second antenna pattern oriented for communication along the leftward direction; and
a second element sidewall coupled to the substrate.

12. The semiconductor device of claim 6, wherein:
the first antenna element comprises:
the first element head side facing a vertical direction, with the first antenna pattern oriented for communication along the vertical direction; and
the first element base side coupled to the substrate; and
the second antenna element comprises:
a second element head side facing a rightward direction, with a second antenna pattern oriented for communication along the rightward direction; and
a second element sidewall coupled to the substrate.

13. The semiconductor device of claim 12, comprising:
a third antenna element coupled to the substrate at the substrate upward portion and comprising:
a third element head side facing an upward direction, with a third antenna pattern oriented for communication along the upward direction; and
a third element sidewall coupled to the substrate.

14. The semiconductor device of claim 13, comprising:
a fourth antenna element coupled to the substrate at the substrate downward portion and comprising:
a fourth element head side facing a downward direction, with a fourth antenna pattern oriented for communication along the downward direction; and
a fourth element sidewall coupled to the substrate.

15. The semiconductor device of claim 14, comprising:
a fifth antenna element coupled to the substrate at the substrate leftward portion and comprising:
a fifth element head side facing a leftward direction, with a fifth antenna pattern oriented for communication along the leftward direction; and
a fifth element sidewall coupled to the substrate.

16. The semiconductor device of claim 15, comprising:
a sixth antenna element coupled to the substrate at the substrate rightward portion and comprising:
a sixth element head side, with a sixth antenna pattern oriented for communication along the vertical direction; and
a sixth element sidewall coupled to the substrate.

17. The semiconductor device of claim 6, wherein:
the electronic component is coupled to the substrate bottom side.

18. The semiconductor device of claim 17, comprising:
a passive component coupled to the substrate over the electronic component.

19. The semiconductor device of claim 6, comprising:
a passive component coupled to the substrate top side between the first antenna element and the second antenna element.

20. A method comprising:
providing a substrate comprising:
a substrate top side;
a substrate bottom side;
a substrate dielectric structure between the substrate top side and the substrate bottom side; and
a substrate conductive structure traversing the substrate dielectric structure and comprising:
a first substrate terminal; and
a second substrate terminal at the substrate top side;
coupling an electronic component to the substrate, the electronic component comprising:

a component terminal coupled to the first substrate terminal; and coupling a first antenna element to the substrate, the first antenna element comprising:
- a first element dielectric structure;
- a first antenna pattern coupled to the first element dielectric structure;
- a first element terminal exposed from the first element dielectric structure;
- a first element head side adjacent first antenna pattern;
- a first element base side opposite the first element head side; and
- a first element sidewall between the first element head side and the first element base side;

wherein:
- a bottom side of the first element terminal is exposed from the first element dielectric structure at the first element base side and a lateral side of the first element terminal is exposed from the first element dielectric structure at the first element sidewall, and at least one of the bottom side of the first element terminal or the lateral side of the first element terminal is coupled to the second substrate terminal;
- the first antenna pattern is coupled to the substrate through the first element terminal;
- the first antenna element is coupled to the substrate outside a footprint of the electronic component; and
- the substrate conductive structure couples the first antenna element to the electronic component.

21. The semiconductor device of claim 6, wherein the first antenna element is similar to the second antenna element.

22. The semiconductor device of claim 6, wherein the first antenna pattern of the first antenna element is identical to a second antenna pattern of the second antenna element.

23. The semiconductor device of claim 6, wherein the first antenna pattern of the first antenna element is different from a second antenna pattern of the second antenna element.

* * * * *